(12) United States Patent
Parkin

(10) Patent No.: US 7,357,995 B2
(45) Date of Patent: *Apr. 15, 2008

(54) MAGNETIC TUNNEL BARRIERS AND ASSOCIATED MAGNETIC TUNNEL JUNCTIONS WITH HIGH TUNNELING MAGNETORESISTANCE

(75) Inventor: Stuart Stephen Papworth Parkin, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 590 days.

This patent is subject to a terminal disclaimer.

(21) Appl. No.: 10/884,696

(22) Filed: Jul. 2, 2004

(65) Prior Publication Data
US 2008/0062581 A1 Mar. 13, 2008

(51) Int. Cl.
*G11B 5/39* (2006.01)
*G11B 5/127* (2006.01)

(52) U.S. Cl. .................. 428/811.1; 428/811.2; 428/812; 428/816; 360/324.11; 360/324.12; 360/324.2

(58) Field of Classification Search ............ None
See application file for complete search history.

(56) References Cited

U.S. PATENT DOCUMENTS

| 5,390,061 | A | 2/1995 | Nakatani et al. |
| 5,465,185 | A | 11/1995 | Heim et al. |
| 5,640,343 | A | 6/1997 | Gallagher et al. |
| 5,650,958 | A | 7/1997 | Gallagher et al. |
| 5,729,410 | A | 3/1998 | Fontana, Jr. et al. |
| 5,764,567 | A | 6/1998 | Parkin |
| 5,841,692 | A | 11/1998 | Gallagher et al. |
| 5,862,022 | A | 1/1999 | Noguchi et al. |
| 6,165,607 | A | 12/2000 | Yamanobe et al. |
| 6,166,948 | A | 12/2000 | Parkin et al. |

(Continued)

FOREIGN PATENT DOCUMENTS

WO 02/075344 A2 9/2002

(Continued)

OTHER PUBLICATIONS

X-F. Han et al., "Fabrication of high-magnetoresistance tunnel junctions using Co75Fe25 ferromagnetic electrodes", Applied Physics Letters, vol. 77, No. 2, Jul. 10, 2000, pp. 283-285.

(Continued)

*Primary Examiner*—Kevin M. Bernatz
(74) *Attorney, Agent, or Firm*—Daniel E. Johnson

(57) ABSTRACT

Magnetic tunneling devices are formed from a first body centered cubic (bcc) magnetic layer and a second bcc magnetic layer. At least one spacer layer of bcc material between these magnetic layers exchange couples the first and second bcc magnetic layers. A tunnel barrier in proximity with the second magnetic layer permits spin-polarized current to pass between the tunnel barrier and the second layer; the tunnel barrier may be either MgO and Mg—ZnO. The first magnetic layer, the spacer layer, the second magnetic layer, and the tunnel barrier are all preferably (100) oriented. The MgO and Mg—ZnO tunnel barriers are prepared by first depositing a metallic layer on the second magnetic layer (e.g., a Mg layer), thereby substantially reducing the oxygen content in this magnetic layer, which improves the performance of the tunnel barriers.

54 Claims, 15 Drawing Sheets

U.S. PATENT DOCUMENTS

| | | |
|---|---|---|
| 6,172,859 B1 | 1/2001 | Watanabe et al. |
| 6,249,407 B1 | 6/2001 | Aoshima et al. |
| 6,338,899 B1 | 1/2002 | Fukuzawa et al. |
| 6,365,286 B1 | 4/2002 | Inomata et al. |
| 6,392,281 B1 | 5/2002 | Tsuge |
| 6,449,135 B1 | 9/2002 | Ding et al. |
| 6,518,588 B1 | 2/2003 | Parkin et al. |
| 6,603,642 B1 | 8/2003 | Araki et al. |
| 6,674,617 B2 | 1/2004 | Gill |
| 6,687,099 B2 | 2/2004 | Nakatani et al. |
| 6,767,655 B2 * | 7/2004 | Hiramoto et al. ........ 428/811.2 |
| 6,791,792 B2 | 9/2004 | Takahashi |
| 6,819,532 B2 | 11/2004 | Kamijo |
| 6,841,395 B2 | 1/2005 | Linn et al. |
| 6,963,096 B2 | 11/2005 | Schmidt et al. |
| 7,212,385 B2 | 5/2007 | Hayakawa |
| 7,270,896 B2 * | 9/2007 | Parkin .................... 428/811.1 |
| 2001/0043448 A1 | 11/2001 | Iwasaki et al. |
| 2002/0006020 A1 | 1/2002 | Hasegawa |
| 2002/0015269 A1 | 2/2002 | Iwasaki et al. |
| 2002/0034094 A1 | 3/2002 | Saito et al. |
| 2002/0054462 A1 | 5/2002 | Sun et al. |
| 2002/0076940 A1 | 6/2002 | Hibino |
| 2002/0085319 A1 | 7/2002 | Hayakawa |
| 2002/0191354 A1 | 12/2002 | Yoshikawa et al. |
| 2003/0128483 A1 | 7/2003 | Kamijo |
| 2003/0157373 A1 | 8/2003 | Kirino et al. |
| 2003/0161181 A1 | 8/2003 | Saito et al. |
| 2003/0169542 A1 | 9/2003 | Gill |
| 2003/0179071 A1 | 9/2003 | Hiramoto et al. |
| 2003/0197984 A1 | 10/2003 | Inomata et al. |
| 2003/0227799 A1 | 12/2003 | Higo et al. |
| 2004/0023075 A1 | 2/2004 | Saito et al. |
| 2004/0144995 A1 | 7/2004 | Nagahama et al. |
| 2004/0207961 A1 | 10/2004 | Ichimura et al. |
| 2004/0234815 A1 * | 11/2004 | Drewes ...................... 428/692 |
| 2005/0094327 A1 * | 5/2005 | Okuno et al. ............ 360/324.2 |
| 2005/0152077 A1 | 7/2005 | Yuasa et al. |
| 2006/0164759 A1 * | 7/2006 | Okada et al. ............... 360/126 |
| 2007/0154740 A1 * | 7/2007 | Yuasa et al. ................ 428/812 |

FOREIGN PATENT DOCUMENTS

| | | |
|---|---|---|
| WO | 02/099905 A1 | 12/2002 |

OTHER PUBLICATIONS

S. Yuasa et al., "High Tunnel Magnetoresistance at Room Temperature in Fully Epitaxial Fe/MgO/Fe Tunnel Junctions due to Coherent Spin-Polarized Tunneling", Japanese Journal of Applied Physics, vol. 43, No. 4B, 2004, pp. L588-L590.

W. H. Butler et al., "Spin-dependent tunneling conductance of Fe/MgO/Fe sandwiches", Physical Review B, vol. 63, 2001, pp. 054416-1 through 054416-12.

M. Tsunoda et al., "60% magnetoresistance at room temperature in Co-Fe/Al-O/Co-Fe tunnel junctions oxidized with Kr-O2 plasma", Applied Physics Letters, vol. 80, No. 17, Apr. 29, 2002, pp. 3135-3137.

J. S. Moodera et al., "Large Magnetoresistance at Room Temperature in Ferromagnetic Thin Film Tunnel Junctions", Physical Review Letters, vol. 74, No. 16, Apr. 17, 1995, pp. 3273-3276.

S. S. P. Parkin et al., "Exchange-biased magnetic tunnel junctions and application to nonvolatile magnetic random access memory (invited)", Journal of Appl. Physics, vol. 85, No. 8, Apr. 15, 1999, pp. 5828-5833.

T. Miyazaki et al., "Giant magnetic tunneling effect in Fe/Al2O3/Fe junction", Journal of Magnetism and Magnetic Materials, vol. 139, 1995, pp. L231-L234.

M. Julliere, "Tunneling Between Ferromagnetic Films", Physics Letters, vol. 54A, No. 3, Sep. 8, 1975, pp. 225-226.

S. S. P. Parkin et al., "Oscillations in Exchange Coupling and Magnetoresistance in Metallic Superlattice Structures: Co/Ru, Co/Cr, and Fe/Cr", Physical Review Letters, vol. 64, No. 19, May 7, 1990, pp. 2304-2307.

S. S. P. Parkin, "Systematic Variation of the Strength and Oscillation Period of Indirect Magnetic Exchange Coupling through the 3d, 4d, and 5d Transition Metals", Physical Review Letters, vol. 67, No. 25, Dec. 16, 1991, pp. 3598-3601.

D. C. Worledge et al., "Magnetoresistance measurement of unpatterned magnetic tunnel junction wafers by current-in-plane tunneling", Applied Physics Letters, vol. 83, No. 1, Jul. 7, 2003, pp. 84-86.

S. Yuasa et al., "High Tunnel Magnetoresistance at Room Temperature in Fully Epitaxial Fe/MgO/Fe Tunnel Junctions due to Coherent Spin-Polarized Tunneling", Japanese Journal of Applied Physics, Apr. 2, 2004, p. L588, vol. 43, No. 4B, Japan.

* cited by examiner

MAGNETIC TUNNEL BARRIERS AND ASSOCIATED MAGNETIC TUNNEL JUNCTIONS WITH HIGH TUNNELING MAGNETORESISTANCE

The U.S. Government has a paid-up license in this invention and the right in limited circumstances to require the patent owner to license others on reasonable terms as provided for by the terms of contract MDA972-99-C-0009 awarded by DARPA.

TECHNICAL FIELD

The invention relates to magnetic tunnel junction (MTJ) magnetoresistive (MR) devices for use as magnetic field sensors such as read heads for reading magnetically recorded data, as memory cells in nonvolatile magnetic random access memory (MRAM) cells, and for magnetic logic and spintronic applications. More particularly, this invention relates to an improved MTJ exhibiting high tunneling magnetoresistance with one or more electrodes formed from ferromagnetic layers coupled antiparallel to one another.

BACKGROUND OF THE INVENTION

The basic component of a magnetic tunnel junction is a sandwich of two thin ferromagnetic and/or ferrimagnetic layers separated by a very thin insulating layer through which electrons can tunnel. The tunneling current is typically higher when the magnetic moments of the ferromagnetic (F) layers are parallel and lower when the magnetic moments of the two ferromagnetic layers are anti-parallel. The change in conductance for these two magnetic states can be described as a magneto-resistance. Here the tunneling magnetoresistance (TMR) of the MTJ is defined as $(R_{AP}-R_P)/R_P$ where $R_P$ and $R_{AP}$ are the resistance of the MTJ for parallel and anti-parallel alignment of the ferromagnetic layers, respectively. MTJ devices have been proposed as memory cells for nonvolatile solid state memory and as external magnetic field sensors, such as TMR read sensors for heads for magnetic recording systems. For a memory cell application, one of the ferromagnetic layers in the MTJ is the reference layer and has its magnetic moment fixed or pinned, so that its magnetic moment is unaffected by the presence of the magnetic fields applied to the device during its operation. The other ferromagnetic layer in the sandwich is the storage layer, whose moment responds to magnetic fields applied during operation of the device. In the quiescent state, in the absence of any applied magnetic field within the memory cell, the storage layer magnetic moment is designed to be either parallel (P) or anti-parallel (AP) to the magnetic moment of the reference ferromagnetic layer. For a TMR field sensor for read head applications, the reference ferromagnetic layer has its magnetic moment fixed or pinned so as to be generally perpendicular to the magnetic moment of the free or sensing ferromagnetic layer in the absence of an external magnetic field. The use of an MTJ device as a memory cell in an MRAM array is described in U.S. Pat. No. 5,640,343. The use of an MTJ device as a MR read head has been described in U.S. Pat. Nos. 5,390,061; 5,650,958; 5,729,410 and 5,764,567.

FIG. 1A illustrates a cross-section of a conventional prior-art MTJ device. The MTJ 100 includes a bottom "fixed" or "reference" ferromagnetic (F) layer 15, an insulating tunnel barrier layer 24, and a top "free" or "storage" ferromagnetic layer 34. The MTJ 100 has bottom and top electrical leads 12 and 36, respectively, with the bottom lead being formed on a suitable substrate 11, such as a silicon oxide layer. The ferromagnetic layer 15 is called the fixed (or reference) layer because its magnetic moment is prevented from rotating in the presence of an applied magnetic field in the desired range of interest for the MTJ device, e.g., the magnetic field caused by the write current applied to the memory cell from the read/write circuitry of the MRAM. The magnetic moment of the ferromagnetic layer 15, whose direction is indicated by the arrow 90 in FIG. 1A, can be fixed by forming it from a high coercivity magnetic material or by exchange coupling it to an antiferromagnetic layer 16. The magnetic moment of the free ferromagnetic layer 34 is not fixed, and is thus free to rotate in the presence of an applied magnetic field in the range of interest. In the absence of an applied magnetic field, the moments of the ferromagnetic layers 15 and 34 are aligned generally parallel (or anti-parallel) in an MTJ memory cell (as indicated by the double-headed arrow 80 in FIG. 1A) and generally perpendicular in a MTJ magnetoresistive read head. The relative orientation of the magnetic moments of the ferromagnetic layers 15, 34 affects the tunneling current and thus the electrical resistance of the MTJ device. The bottom lead 12, the antiferromagnetic layer 16, and the fixed ferromagnetic layer 15 together may be regarded as constituting the lower electrode 10.

The basic concept of a magnetic tunnel junction was first realized in 1975 (M. Julliére, "*Tunneling between ferromagnetic films*", Phys. Lett. 54A, 225 (1975)), although the TMR was very small and observed only at low temperatures and for very small bias voltages. In 1995 significant TMR effects of about 10% were obtained at room temperature in MTJs with $Al_2O_3$ tunnel barriers by two different groups (J. S. Moodera et al., "*Large magnetoresistance at room temperature in ferromagnetic thin film tunnel junctions*", Phys. Rev. Lett. 74, 3273 (1995); and T. Miyazaki and N. Tezuka, "*Giant magnetic tunneling effect in $Fe/Al_2O_3/Fe$ junction*", J. Magn. Magn. Mat. 139, L231 (1995)). Subsequently, S. S. P. Parkin et al. ("*Exchange-biased Magnetic Tunnel Junctions and Application to Non-Volatile Magnetic Random Access Memory*", J. Appl. Phys. 85, 5828 (1999)) obtained effects as large as about 48-50% by optimizing the growth of the $Al_2O_3$ tunnel barrier, by optimizing the interface between the $Al_2O_3$ tunnel barrier and the ferromagnetic electrodes, and by carefully controlling the magnetic orientation of the ferromagnetic moments using concepts of magnetic engineering, in particular, exchange bias (see U.S. Pat. No. 5,650,958 titled "*Magnetic tunnel junctions with controlled magnetic response*" to W. J. Gallagher et al.) and an anti-parallel coupled pinned ferromagnetic layer (see U.S. Pat. No. 5,841,692 titled "*Magnetic tunnel junction device with antiferromagnetically coupled pinned layer*" to W. J. Gallagher et al.).

The magnetoresistance of MTJs using aluminum oxide tunneling barriers is limited to about 50% at room temperature (S. S. P. Parkin et al., "*Exchange-biased Magnetic Tunnel Junctions and Application to Non-Volatile Magnetic Random Access Memory*", J. Appl. Phys. 85, 5828 (1999); X.-F. Han et al., "*Fabrication of high-magnetoresistance tunnel junctions using $Co_{75}Fe_{25}$ ferromagnetic electrodes*", Appl. Phys. Lett. 77, 283 (2000)), although there have been reports of TMR values of up to about 58% at room temperature (M. Tsunoda et al., "*60% magnetoresistance at room temperature in Co—Fe/Al—O/Co—Fe tunnel junctions oxidized with Kr—O2 plasma*", Appl. Phys. Lett. 80, 3135 (2002)).

For applications of magnetic tunnel junctions for either magnetic recording heads or for non-volatile magnetic memory storage cells, high TMR values are needed for improving the performance of these devices. The speed of operation of the recording head or memory is related to the signal to noise ratio (SNR) provided by the MTJ—higher TMR values will lead to higher SNR values for otherwise the same resistance. Moreover, for memory applications, the larger the TMR, the greater is the variation in resistance of the MTJs from device to device which can be tolerated. Since the resistance of an MTJ depends exponentially on the thickness of the tunneling barrier, small variations in thickness can give rise to large changes in the resistance of the MTJ. Thus high TMR values can be used to mitigate inevitable variations in tunnel barrier thickness from device to device. The resistance of an MTJ device increases inversely with the area of the device. As the density of memory devices increases in the future, the thickness of the tunnel barrier will have to be reduced (for otherwise the same tunnel barrier material) to maintain an optimal resistance of the MTJ memory cell for matching to electronic circuits. Thus a given variation in thickness of the tunnel barrier (introduced by whatever process is used to fabricate the MTJ) will become an increasingly larger proportion of the reduced tunnel barrier thickness and so will likely give rise to larger variations in the resistance of the MTJ device.

U.S. patent application Ser. No. 10/824,835 to Parkin titled "MgO tunnel barriers and method of formation" (filed Apr. 14, 2004) and Ser. No. 10/646,246 to Parkin titled "MgO tunnel barriers and method of formation" (filed Aug. 22, 2003), which are hereby incorporated by reference, disclose methods of forming a tunnel barrier comprised of magnesium oxide (MgO) with which magnetic tunnel junctions can be deposited which exhibit tunneling magnetoresistance values of more than 100% at low bias. The tunnel barrier is formed by first depositing a thin layer of Mg using, for example, magnetron or ion beam sputter deposition followed by a layer of Mg deposited in the presence of oxygen. In addition, Parkin discloses methods of forming highly oriented crystalline MgO tunnel barriers by forming the MgO barrier on a ferromagnetic electrode comprised of a Co—Fe alloy, which is bcc and (100) textured. The CoFe electrode is formed on a (100) oriented antiferromagnetic layer of fcc IrMn which itself is grown highly oriented by forming this layer on suitable underlayers, for example, a combination of a TaN layer followed by a Ta layer.

Useful MTJ devices for magnetic recording read heads or for MRAM memory cells will be of sub-micron dimensions. This leads to very large self-demagnetizing for devices which are not circular in cross-section and very large magnetostatic coupling fields between ferromagnetic layers in the same device. For example, in the conventional device shown in FIG. 1A, there will be a very large interaction between the pinned ferromagnetic layer 15 and the free or storage ferromagnetic layer 34 because of magnetic poles formed at the edges of the device 100. These coupling fields are so large as to make such devices typically unworkable because the direction of the magnetic moment of the storage layer 34, indicated by the arrow 80 in FIG. 1A, will preferentially be oriented antiparallel to that of the direction of the magnetic moment of the fixed ferromagnetic layer 15, indicated by the arrow 90 in FIG. 1A. One method to solve this problem was first proposed by Parkin and Heim with reference to metallic spin-valve giant magnetoresistance sensors in IBM's U.S. Pat. No. 5,465,185, wherein the reference ferromagnetic layer 15 is replaced by a sandwich of two ferromagnetic layers 18 and 19 antiferromagnetically coupled through a metallic spacer layer 17 as shown by the MTJ 100' of FIG. 1B. The lower electrode is now given by the reference numeral 10', and the magnetic orientation of the layers 18 and 19 is given by the arrows 90' and 95, respectively. Parkin showed that the spacer layer can be comprised of a wide variety of non-magnetic metals chosen from the groups of the 3d, 4d, and 5d transition metals as well as the noble metals, Cu, Au and Ag such that the layers 18 and 19 are indirectly exchange coupled through the metallic spacer layer 17 (S. S. P. Parkin et al. "*Oscillations in Exchange Coupling and Magnetoresistance in Metallic Superlattice Structures: Co/Ru, Co/Cr and Fe/Cr*", Phys. Rev. Lett. 64, 2304 (1990) and S. S. P. Parkin, "*Systematic Variation of Strength and Oscillation Period of Indirect Magnetic Exchange Coupling through the 3d, 4d and 5d Transition Metals*", Phys. Rev. Lett. 67, 3598 (1991)). For certain thicknesses of the spacer layer 17, the magnetic moments of the ferromagnetic layers 18 and 19 are antiferromagnetically coupled to one another so that the net magnetic moment of the sandwich can be chosen to be arbitrarily small. Consequently, the demagnetization field from the edges of the layer 18 is reduced by the opposite demagnetizing field arising from the poles at the edges of the layer 19. The net demagnetizing field can be zero by proper choice of the thicknesses and the magnetic material forming layers 18 and 19. In particular Parkin (S. S. P. Parkin et al. "*Oscillations in Exchange Coupling and Magnetoresistance in Metallic Superlattice Structures: Co/Ru, Co/Cr and Fe/Cr*", Phys. Rev. Lett. 64, 2304 (1990)) showed that Ru is a highly preferred antiferromagnetic coupling layer because of the large antiferromagnetic (AF) coupling strength exhibited by very thin layers of Ru and because Ru displays large AF coupling for a wide range of ferromagnetic materials. Moreover, structures using Ru antiferromagnetic coupling layers also display high thermal stability. For these reasons the synthetic antiferromagnetic structure formed from the combination of ferromagnetic layers 18 and 19 separated by a thin Ru layer 17 has become the de facto structure of choice for magnetic recording read heads based on giant magnetoresistance as well as for magnetic tunnel junction memory cells based on spin dependent tunneling using amorphous alumina tunnel barriers. The use of synthetic antiferromagnetic reference layers using Ru antiferromagnetic coupling layers for MTJ sensor and memory applications is described in IBM's U.S. Pat. No. 5,841,692 titled "*Magnetic tunnel junction device with antiferromagnetically coupled pinned layer*" to W. J. Gallagher et al.

However, MTJs with MgO tunnel barriers and synthetic antiferromagnetic reference layers using Ru antiferromagnetic coupling layers do not exhibit the high tunneling magnetoresistance values exhibited by similar MTJs without the synthetic antiferromagnetic reference layer. MTJs without a synthetic antiferromagnetic reference layer suffer from the presence of unwanted coupling fields, as discussed above, since the storage magnetic layer moment has a tendency to be aligned anti-parallel to the reference layer magnetic moment.

What is needed is a method of forming MTJs with high tunneling magnetoresistance and a suitable synthetic antiferromagnet reference layer.

SUMMARY OF THE INVENTION

One preferred embodiment of the invention is a magnetic tunneling device that includes a first body centered cubic (bcc) magnetic layer and a second bcc magnetic layer, in which the first and second magnetic layers include material selected from the group consisting of ferromagnetic materials and ferrimagnetic materials. At least one spacer layer of bcc material is located between the magnetic layers for exchange coupling the first and second bcc magnetic layers. Also, a tunnel barrier is in proximity with (e.g., in contact with) the second magnetic layer to permit spin-polarized current to pass between the tunnel barrier and the second layer; the tunnel barrier is selected from the group consisting of MgO and Mg—ZnO tunnel barriers. Preferably, each of the first magnetic layer, the spacer layer, the second magnetic layer, and the tunnel barrier are (100) oriented and polycrystalline; they may include polycrystalline grains whose lateral extent is in the range of 100 to 500 angstroms. If the tunnel barrier is a MgO tunnel barrier, it may advantageously have a thickness of between 3 and 20 angstroms; if the tunnel barrier is a Mg—ZnO tunnel barrier, it may advantageously have a thickness of between 3 and 50 angstroms. The second magnetic layer is preferably substantially free of oxide, thereby leading to improved performance of the tunnel barrier. Each of the first and second magnetic layers may include an alloy of Co and Fe, in which the Fe content of the alloy is advantageously between 15 and 60 atomic %.

The spacer layer preferably includes Cr, e.g., up to at least 50 atomic % Cr or at least 70 atomic % Cr. Further, the spacer layer may advantageously include a non-ferromagnetic, non-ferrimagnetic alloy of Cr and at least one element selected from the group consisting of V, W, and Fe. Alternatively, the spacer layer may advantageously include an alloy of Cr and Mo, e.g., in which the Mo content of the alloy is between 10 and 50 atomic % and the thickness of the spacer layer is between 10 and 20 angstroms. Alternatively, the spacer layer may advantageously include an alloy of Cr and Nb, e.g., in which the Nb content of the alloy is between 10 and 50 atomic % and the thickness of the spacer layer is between 10 and 20 angstroms. In general, it is preferred that the spacer layer has a thickness of between 3 and 30 angstroms. The spacer layer may exchange couple the magnetic layers so that their magnetic moments are antiparallel, or alternatively, so that they are parallel.

The device may further comprise a free magnetic layer in proximity with (e.g., in contact with) the tunnel barrier, so that the device forms a magnetic tunnel junction, in which the free magnetic layer is selected from the group consisting of ferromagnetic magnetic materials and ferrimagnetic materials. In one preferred embodiment, the free layer includes two bcc magnetic layers that each includes material selected from the group consisting of ferromagnetic materials and ferrimagnetic materials; the free layer further includes at least one additional spacer layer of bcc material between said two additional bcc magnetic layers, in which the additional spacer layer exchange couples the two additional bcc magnetic layers. The device may further include an additional layer in proximity with (e.g., in contact with) the first magnetic layer that forms an exchange bias with the first magnetic layer, in which this additional layer includes at least one anti-ferromagnetic material. The tunneling magnetoresistance of the junction may be at least 50%, at least 70%, or even at least 100% at room temperature.

Another preferred embodiment of the invention is a magnetic tunnel junction (MTJ) device that includes a first (100) oriented, body centered cubic (bcc) magnetic layer and a second (100) oriented, bcc magnetic layer, in which the first and second magnetic layers each include material selected from the group consisting of ferromagnetic materials and ferrimagnetic materials. At least one Cr-containing spacer layer of (100) oriented bcc material is located between the magnetic layers, with the spacer layer exchange coupling the first and second bcc magnetic layers. A (100) oriented tunnel barrier is located in proximity with (e.g., in contact with) the second magnetic layer, in which the tunnel barrier is selected from the group consisting of MgO and Mg—ZnO tunnel barriers. A free magnetic layer is located in proximity with (e.g., in contact with) the tunnel barrier, in which the free magnetic layer includes magnetic material selected from the group consisting of ferromagnetic magnetic materials and ferrimagnetic materials, with the magnetic tunnel junction having a tunneling magnetoresistance of at least 50% at room temperature. In a preferred embodiment, each of the first magnetic layer, the spacer layer, the second magnetic layer, and the tunnel barrier are polycrystalline; they may include polycrystalline grains whose lateral extent is in the range of 100 to 500 angstroms. The device may further include an additional layer in proximity with (e.g., in contact with) the first magnetic layer that forms an exchange bias with the first magnetic layer, in which the additional layer includes at least one anti-ferromagnetic material.

A preferred implementation of the invention is a method that includes forming a tunnel barrier over a first body centered cubic (bcc) magnetic layer and forming a second bcc magnetic layer over the tunnel barrier, in which the first bcc magnetic layer, the tunnel barrier, and the second bcc magnetic layer constitute a magnetic tunnel junction. At least one of (or alternatively both of) the first and second bcc magnetic layers includes two bcc magnetic layers separated by a bcc spacer layer that exchange couples said two bcc magnetic layers. In one preferred implementation, the tunnel barrier is a MgO tunnel barrier, and the MgO tunnel barrier may be advantageously formed by depositing Mg onto a surface to form thereon a Mg layer (in which the surface is selected to be substantially free of oxide, and in which the Mg layer may advantageously have a thickness of between 3 and 20 angstroms), and then directing additional Mg, in the presence of oxygen, towards the Mg layer to form a MgO tunnel barrier in contact with the surface, with the oxygen reacting with the additional Mg and the Mg layer. The MgO tunnel barrier may be annealed at a temperature selected to yield a tunneling magnetoresistance of greater than 70% or even 100% at room temperature. In another preferred implementation, the tunnel barrier is a Mg—ZnO tunnel barrier, and the Mg—ZnO tunnel barrier may be advantageously formed by depositing a metal layer onto a surface selected to be substantially free of oxide, and then directing additional metal towards the metal layer, in the presence of oxygen, to form a magnesium-zinc oxide tunnel barrier in contact with the surface, with the oxygen reacting with the additional metal and the metal layer. In this case, at least one of the metal layer and the additional metal includes Zn, and at least one of the metal layer and the additional metal includes Mg. The Mg—ZnO tunnel barrier may advantageously have a thickness of between 3 and 50 angstroms, and may be annealed at a temperature selected to yield a tunneling magnetoresistance of greater than 50% at room temperature.

In preferred implementations of the method, the tunnel barrier, the first bcc magnetic layer, and the second bcc magnetic layer are each (100) oriented to improve the performance of the tunnel element. Also, each of the tunnel barrier, the first bcc magnetic layer, and the second bcc magnetic layer may advantageously be polycrystalline and include polycrystalline grains whose lateral extent is in the range of 100 to 500 angstroms. The spacer layer may advantageously include Cr, e.g., at least 50 atomic % Cr or at least 70 atomic % Cr. The spacer layer may also include a single-phase, non-ferromagnetic, non-ferrimagnetic alloy of Cr and at least one element selected from the group consisting of V, Nb, Mo, W, and Fe, e.g., in which the concentration of said at least one element is selected to lattice match the spacer layer with the bcc magnetic layers.

In preferred implementations of the method, the tunnel barrier is annealed to improve its performance. The tunnel barrier may be annealed at a temperature greater than 300° C. or even 340° C. The tunnel barrier may be advantageously annealed at a temperature in the range of 300° C. to 400° C.

The MgO and Mg—ZnO tunnel barriers of the magnetic tunnel junction devices disclosed herein are preferably prepared according to methods in which the lower ferromagnetic (or ferrimagnetic) electrode is not oxidized, so as to give much higher tunnel magnetoresistance values than in the prior art. Similarly, much higher spin polarization values of tunneling current are obtained in tunnel junction devices with one or more ferromagnetic (or ferrimagnetic) electrodes. The MgO or Mg—ZnO tunnel barrier so formed does not have a significant number of defects that would otherwise lead to hopping conductivity through the tunnel barrier. In preferred methods, highly oriented (100) MgO or Mg—ZnO barriers are formed without using single crystalline substrates or high deposition temperatures, thereby facilitating the manufacture of devices using standard deposition techniques on polycrystalline or amorphous films. Post anneal treatments are preferred to improve the tunneling magnetoresistance, which for the MgO structures disclosed herein can exceed 50, 70, 100 or even 125% at room temperature, and which for the Mg—ZnO structures disclosed herein can exceed 50% at room temperature.

For several aspects and embodiments of the invention disclosed herein, a MgO or Mg—ZnO tunnel barrier is sandwiched between an underlayer and an overlayer, either one or both of which may include one or more layers of a ferromagnetic material, a ferrimagnetic material, and/or a semiconductor. While the MgO (or Mg—ZnO) tunnel barrier is preferably in direct contact with the ferromagnetic material, ferrimagnetic material and/or semiconductor, each of the underlayer and overlayer may optionally include one or more spacer layers which are adjacent to the tunnel barrier but which do not significantly affect the tunneling properties of the MgO (or Mg—ZnO) layer, e.g., by not significantly diminishing the spin polarization of electrons tunneling through the tunnel barrier. (It should be understood that the terms underlayer and overlayer do not necessarily imply any particular orientation with respect to gravity.)

Performance of the MgO (or Mg—ZnO) tunnel barriers disclosed herein may be improved through annealing, wherein performance refers to various attributes of the tunnel barrier or associated device. For example, annealing a magnetic tunnel junction improves, in particular, its magneto-tunneling resistance; annealing a tunnel barrier improves, in particular, its spin polarization. In particular by annealing these tunnel barriers, tunneling magneto-resistance of more than 100% can readily be achieved using methods of thin film deposition and substrate materials compatible with conventional manufacturing technologies. Annealing temperatures may be in the range from 200° C. to 400° C.; however, the best tunnel barrier performance was obtained for annealing temperatures in the range from 300° C. to 400° C. The same anneal that improves the tunneling magnetoresistance may also be used to set the direction of an exchange bias field provided by an antiferromagnetic exchange bias layer.

The preferred embodiments and implementations herein are directed to structures in which the magnetic material has a body-centered cubic (bcc) lattice, since this lattice type leads to the best performance of the MgO or Mg—ZnO tunnel barrier (e.g., the highest TMR for a tunnel junction). It should be noted, however, that in thin films, because of strain induced by overlayers and/or underlayers, the in-plane and out-of-plane lattice constants may be slightly different, and the lattice may be slightly distorted from the pure bcc case, e.g., as a result of a tetragonal distortion. As used herein, the term "body centered cubic" (bcc) should be construed broadly enough to encompass such deviations from the pure bcc case.

The preferred embodiments and implementations of the invention are directed to magnetic layers and MgO or Mg—ZnO tunnel barrier layers which are substantially (100) oriented or textured. The magnetic and tunnel barrier layers are polycrystalline and are comprised of grains or crystallites which range in lateral extent from approximately one hundred to several hundred angstroms. Thus, these layers and the overall film structure are what is commonly referred to as textured. Texturing implies that there is a predominant crystallographic orientation of individual layers and/or the overall film structure, but that the grains are not perfectly aligned along one particular direction. Individual grains may not be precisely oriented with their (100) direction along the normal to the film layer, but the (100) direction within individual grains may be oriented away from the normal to the plane of the film by an angle that can vary from a small fraction of one degree to several degrees or even tens of degrees for poorly textured films. The angular range of these (100) directions can be used to quantify the degree of (100) crystalline texture of the film structure and can be measured using various structural characterization techniques, including cross-section transmission electron microscopy and various x-ray diffraction techniques. There may also be present grains which are oriented in a completely different direction, but the proportion of these grains is small for the method of formation of the magnetic tunnel junction structures described herein. Note that the crystalline grains are randomly oriented with respect to a direction within the plane of the substrate on which the film structures are grown. It is the orientation or texturing of the film which is important with regard to the preferred embodiments herein. Whereas the maximum TMR is obtained for film structures which are highly textured, the TMR will be increased to the extent that the film structure is textured. It is preferred that the angular range of a (100) direction within the grains be within + or −20 degrees of the film normal, or more preferably within + or −10 degrees, and even more preferably within + or −5 degrees. As used herein, the term "(100) oriented" should be understood to include the aforementioned deviations from the ideal case, in which all the grains are precisely oriented with their (100) direction along the normal to the film layer.

Notwithstanding the polycrystalline nature of the film structures described herein, which are in any case preferable for ease of manufacturing, the method of forming the MgO (or Mg—ZnO) tunnel barrier described herein can also be applied to the growth of epitaxial single crystalline film structures, wherein the structures are prepared on a face of a single crystalline substrate chosen so that the crystalline spacing and crystalline cell is compatible with the growth of a bcc ferromagnetic metal layer oriented in the (100) growth direction and the subsequent growth of a MgO (or Mg—ZnO) tunnel barrier according one of the preferred embodiments described herein.

For a fuller understanding of the nature and advantages of the present invention, reference should be made to the following detailed description taken together with the accompanying figures.

BRIEF DESCRIPTION OF THE DRAWINGS

FIG. 1, which includes FIG. 1A shows a magnetic tunnel junction with a reference and a storage ferromagnetic layer, and FIG. 1B shows a magnetic tunnel junction device with a reference layer formed from a synthetic antiferromagnet and a storage ferromagnetic layer.

FIGS. 4A and 4B, shows the dependence of tunneling magnetoresistance on the applied magnetic field in the plane of a magnetic tunnel junction device for the structure shown in FIG. 3. FIG. 4A shows a major loop and FIG. 4B shows a minor loop.

FIGS. 5A and 5B, shows the dependence of the tunneling magnetoresistance (in FIG. 5A) and the antiferromagnetic coupling field (in FIG. 5B) for various MTJs of the present invention with two different Co—Fe alloy reference layer compositions, as a function of thickness of the Cr—Mo antiferromagnetic coupling layer for two different Cr—Mo compositions.

FIG. 6A shows major loops, and FIG. 6B shows minor loops.

FIGS. 7A and 7B, shows a series of tunneling magnetoresistance versus field loops measured at 25° C. as a function of successively higher anneal temperatures for an MTJ device of the present invention. FIG. 7A shows a major loop, and FIG. 7B shows a minor loop.

FIGS. 8A and 8B, shows a series of resistance versus field loops measured at 25° C. as a function of successively higher anneal temperatures for an MTJ device of the present invention. FIG. 8A shows a major loop, and FIG. 8B shows a minor loop.

FIGS. 9A and 9B, shows a series of resistance versus field loops measured at 25° C. as a function of successively higher anneal temperatures for an MTJ device of the present invention. FIG. 9A shows a major loop, and FIG. 9B shows a minor loop.

FIGS. 10A and 10B, shows a series of resistance versus field loops measured at 25° C. as a function of successively higher anneal temperatures for an MTJ device of the present invention. FIG. 10A shows a major loop, and FIG. 10B shows a minor loop.

DESCRIPTION OF THE PREFERRED EMBODIMENTS

The possibility of high tunneling magnetoresistance in MTJs formed from Fe/MgO/Fe sandwiches where the tunnel barrier is formed from crystalline (100) oriented MgO layers was theorized by W. H. Butler, X.-G. Zhang, T. C. Schulthess et al., Phys. Rev. B 63, 054416 (2001). However, extensive experimental work by many groups over a period of several years showed no evidence for improved tunneling magnetoresistance values using crystalline (100) MgO tunnel barriers as compared to amorphous alumina tunnel barriers. It was speculated that during the formation of the MgO tunnel barrier, the surface of the lower Fe electrode became oxidized perhaps resulting in much lower TMR than theorized. In U.S. patent application Ser. No. 10/824,835 to Parkin titled "MgO tunnel barriers and method of formation" (filed Apr. 14, 2004), supra, a method for forming MgO tunnel barriers is described which gives rise to MTJs which exhibit extraordinarily high values of tunneling magnetoresistance. To prevent the oxidation of a lower electrode formed from Fe, a method of forming the MgO barrier was developed in which a thin layer of metallic Mg was first deposited on top of the Fe layer and then a layer of MgO was deposited on top of this Mg layer through the reactive sputtering of Mg in an Ar—$O_2$ plasma. Using this method of preparing the MgO barrier, very high tunneling magnetoresistance values were obtained, much higher than any previously reported values for any MTJ at room temperature.

Figure 1A:
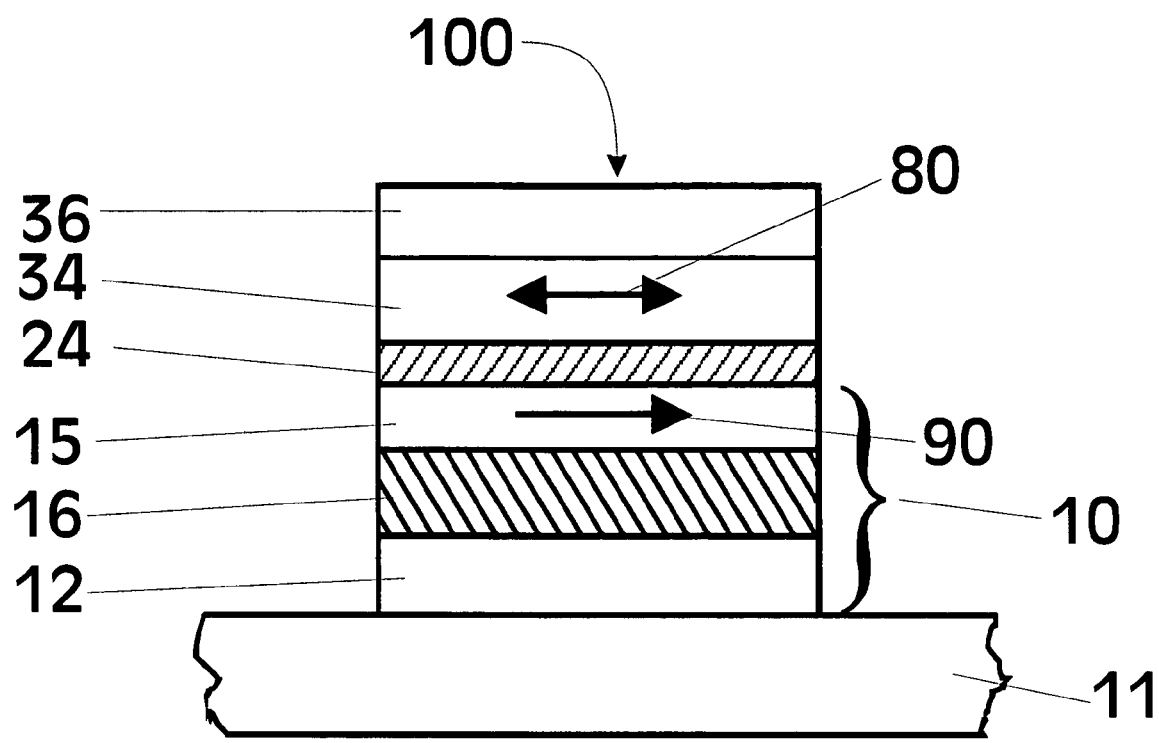
FIGS. 1A and 1B, is a schematic of a magnetic tunnel junction formed in accordance with the prior art.
Figure 1B:
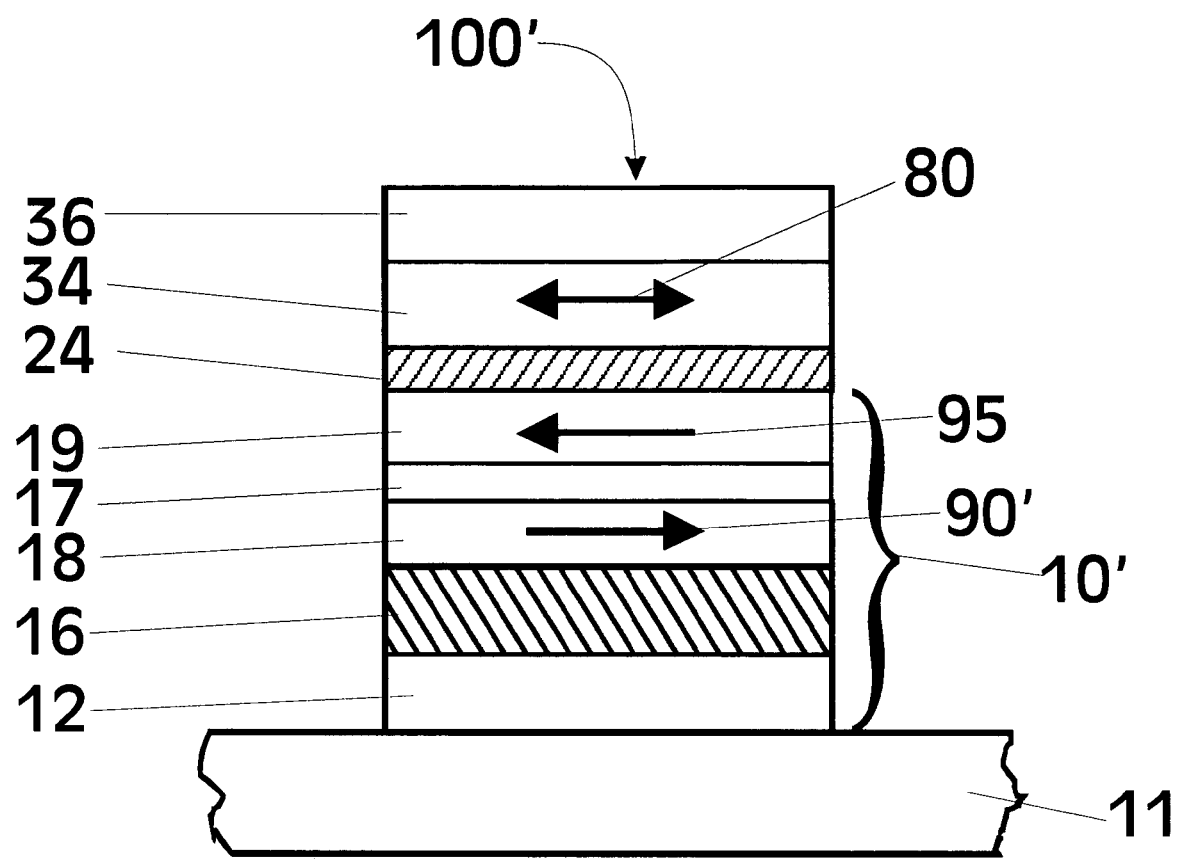
Figure 2A:
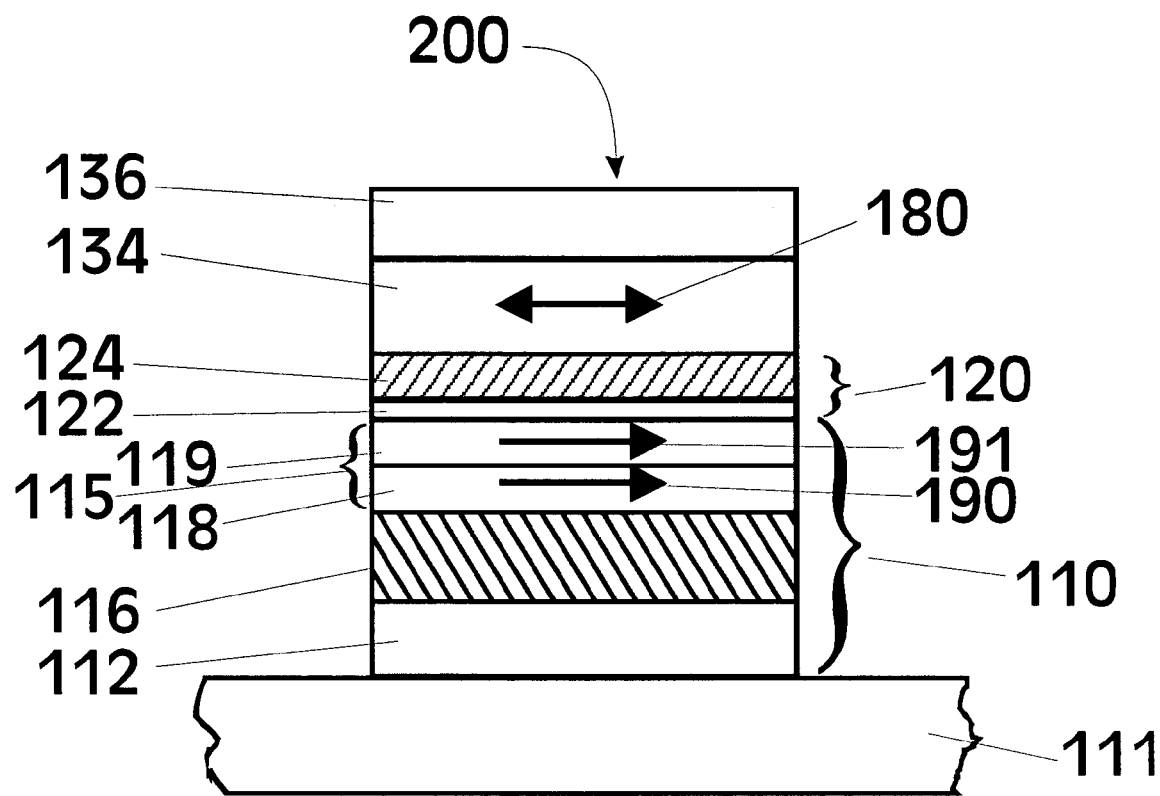
FIG. 2A illustrates the sequence of layers that are deposited to form a magnetic tunnel junction having high tunneling magnetoresistance (TMR).
Figure 2B:
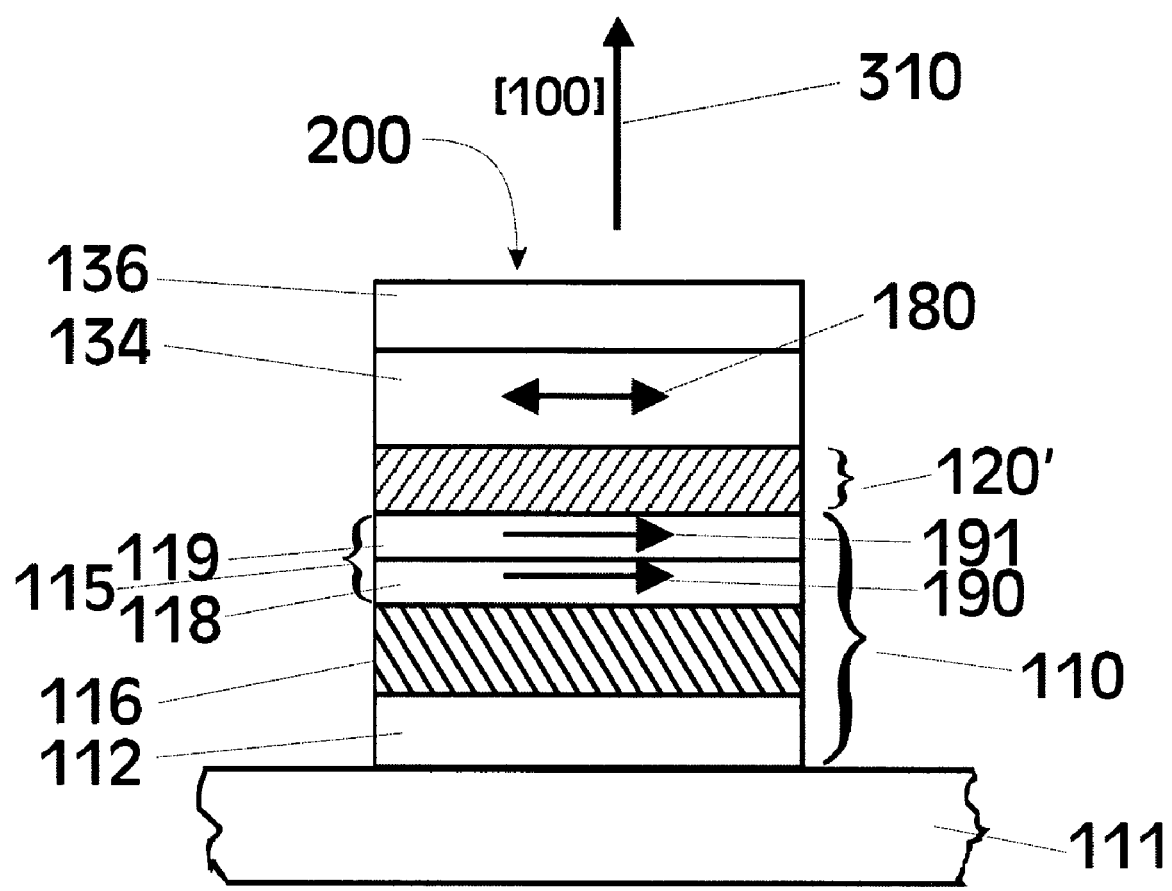
FIG. 2B is a cross sectional view of the magnetic tunnel junction that is formed according to the methodology of FIG. 2A.

FIG. 2A illustrates this process, in which a tunnel barrier 120 is formed by first depositing a thin Mg layer 122 followed by deposition by reactive sputtering of an MgO layer 124. As shown in FIG. 2B, it is more appropriate to view the MgO tunnel barrier as a single layer 120', since the layer 122 is oxidized to form MgO, with the layers 122 and 124 becoming largely indistinguishable as a result. For example, the layers 122 and 124 are not distinguishable in a cross-sectioned slice of the device examined in a transmission electron microscope. The thickness of the resulting MgO layer 120' is preferably in the range of 3-50 angstroms, more preferably 3-30 angstroms, still more preferably 3-20 angstroms, and most preferably 4-15 angstroms. FIG. 2A shows a device that includes a substrate 111, a bottom electrical lead 112, an antiferromagnetic layer 116, a fixed ferromagnetic (or ferrimagnetic) layer 118, a "free" ferromagnetic (or ferrimagnetic) layer 134, and a top electrical lead 136, all of which are similar to their FIG. 1B counterparts 11, 12, 16, 18, 34, and 36, respectively; these layers, as well as other layers and components referred to herein, may be constructed using techniques known to those skilled in the art. The arrows 180 and 190 illustrate possible orientations of the magnetic moments of the free ferromagnetic layer 134 and the fixed ferromagnetic layer 118, respectively. As shown in FIGS. 2A and 2B, the fixed ferromagnetic layer may actually be a bilayer 115 of two different ferromagnetic layers 118 and 119, each having a magnetic moment oriented as indicated by the arrows 190 and 191, respectively. The bilayer 115, the antiferromagnetic layer 116, and the bottom lead 112 of FIGS. 2A and 2B constitute a lower electrode 110.

MTJ structures formed according to the method described in U.S. patent application Ser. No. 10/824,835 to Parkin titled "MgO tunnel barriers and method of formation" (filed Apr. 14, 2004), supra, exhibit very high tunneling magnetoresistance values of more than 160% at room temperature. However, the high tunneling magnetoresistance is derived, not only from using a method of forming the MgO tunnel barrier which does not oxidize the lower ferromagnetic electrode, but also from forming a crystalline structure in which the ferromagnetic electrodes directly above and below the (100) textured MgO tunnel barrier have a bcc crystalline structure and are also textured in the (100) orientation. The layer 115 is preferably formed from a bcc alloy formed from one or more of Co and Fe. For example, layer 118 may be formed from Fe or $CO_{84}Fe_{16}$ and layer 119 may be formed from $CO_{70}Fe_{30}$. The crystallographic texture of these layers can be controlled by suitable choice of the underlayers. For example layer 112 may be formed from a bi-layer of TaN and Ta or from a layer of Ta alone. Layer 116 may be formed from an fcc antiferromagnetic alloy of Ir and Mn where the composition of Ir is less than ~30 atomic percent. The IrMn layer grows highly oriented in the (100) orientation when deposited on the layer 112 formed from Ta or TaN/Ta. The substrate 111 may be comprised of an amorphous material such as $SiO_2$. Using this combination of underlayers, the layer 115, comprised of one or more bcc Co—Fe alloys, is textured in the (100) orientation and the MTJ 200 displays high TMR.

A method of forming $Mg_{1-x}Zn_xO$ tunnel barriers is now described in connection with FIGS. 2A and 2B; $Mg_{1-x}Zn_xO$ tunnel barriers may be used instead of MgO tunnel barriers in the structures disclosed herein to form alternative embodiments. (See also U.S. application Ser. No. 10/734,425 to Parkin titled "Mg—Zn oxide tunnel barriers and method of formation" filed Dec. 12, 2003, which is hereby incorporated by reference.) The $Mg_{1-x}Zn_xO$ tunnel barriers are formed by i) first depositing, for example, a Mg—Zn layer without any oxygen (so that this Mg—Zn layer covers the underlying ferromagnetic or ferrimagnetic layer), and then by ii) depositing, for example, a layer of Mg—Zn in the presence of reactive oxygen during which process the previously deposited first Mg—Zn layer is oxidized, thereby forming the tunnel barrier.

The Mg—Zn composition of the metal layer 122 does not need to be the same as the Mg—Zn composition of the oxide layer 124. Indeed the layer 122 can be formed from pure Mg and the layer 124 can be formed from pure ZnO. Alternatively, the layer 122 can be formed from pure Mg and the layer 124 from $[Mg_{1-x}Zn_x]O$. Alternatively, the layer 122 can be formed from an alloy with a composition $[Mg_{1-y}Zn_y]$, whereas the layer 124 can be formed by the deposition of a layer of composition $[Mg_{1-z}Zn_z]$ in the presence of reactive oxygen. In general, to form a Mg—Zn oxide tunnel barrier according to preferred implementations of the invention herein, it is only necessary that one of the layers 122 and 124 include Mg and that the other of these layers include Zn.

The Zn concentration in the layer 122 can be higher or lower than that of the layer 124. The concentration of Zn in the layer 122 is preferably chosen to optimize the growth of the Mg—ZnO tunneling barrier 120' as well as for the target RA value. More Zn will lead to an oxide barrier with a reduced tunnel barrier height and so lower RA. Similarly, increasing the concentration of Zn in the oxide layer 124 will also lead to lower tunneling barrier heights and so to lower RA values. For the optimal tunnel barrier with the highest thermal stability, it may be preferable to form the layer 122 from an alloy of Mg—Zn with less Zn or even from pure Mg. It may also be preferable to form a tunnel barrier by first depositing a layer of Mg or a Mg—Zn alloy with small amounts of Zn, then by secondly depositing a layer of $[Mg_{1-x}Zn_x]$ in the presence of reactive oxygen (in which this layer contains a higher concentration of Zn), then by thirdly depositing a layer of Mg or $[Mg_{1-x}Zn_x]$ with lower concentrations of Zn in the presence of reactive oxygen. (In this case, Mg—Zn oxide tunnel barriers of two or more layers may be formed. These layers may be of the form $[Zn_{1-x}Mg_x]O$, in which the Mg atomic percentage is between 1 and 100, or between 1 and 99.) In general it may be advantageous to form the tunnel barrier 120' from a first layer of Zn or Mg or Mg—Zn, and then by depositing a sequence of Zn or Mg or Mg—Zn additional layers, in which each of the additional layers is formed in the presence of reactive oxygen. The amount of reactive oxygen may be varied from layer to layer. For example, it may be advantageous to have more oxygen for higher concentrations of Zn. It may also be preferable to have less reactive oxygen in the last additional layer onto which the ferromagnetic electrode 134 is subsequently deposited. The Mg—ZnO tunnel barrier 120' so formed may advantageously have a thickness of between 3 and 50 angstroms.

High tunneling magnetoresistance values have been found for a wide composition range of the ternary $[Mg_{1-x}Zn_x]O$ oxides, although the values are not typically as high as those found for oxides without any zinc. Typically, just as for MgO tunnel barriers, the TMR values were increased for thermal annealing at moderate temperatures, although the thermal stability was reduced compared to that of zinc-free MgO tunnel barriers. The thermal stability is very sensitive to the oxidation state of the $[Mg_{1-x}Zn_x]O$ layer, so that the properties of the MTJs are strongly dependent on the reactive sputtering conditions under which these oxide layers are formed, especially to the ratio of argon and oxygen in the sputter gas mixture.

Figure 2C:
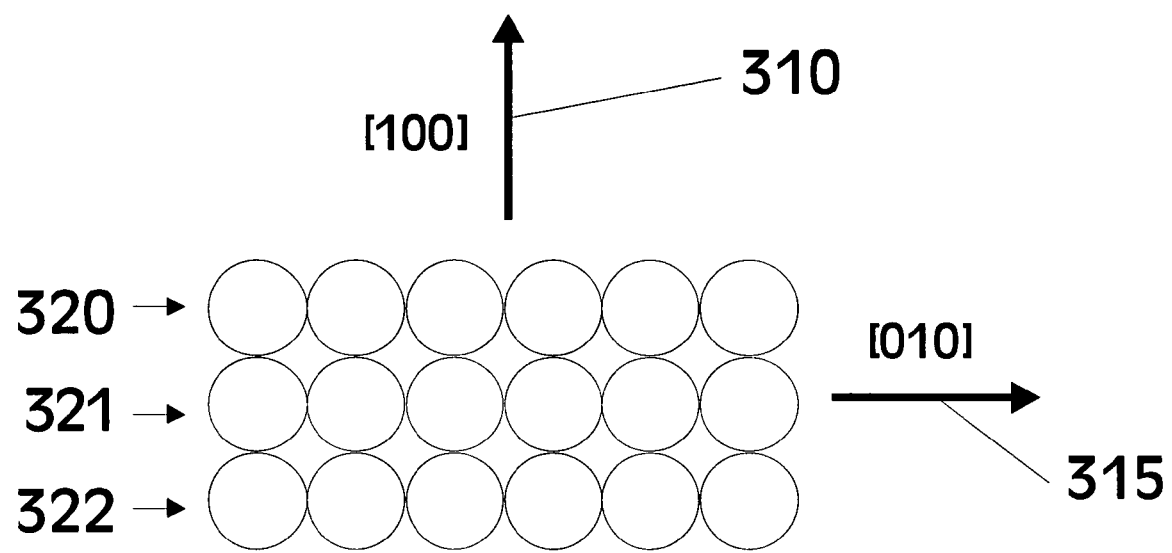
FIG. 2C is a schematic cross-section of the arrangement of the atoms in one of the layers of the textured magnetic tunnel junction formed according to the methodology of FIG. 2A.
Figure 2D:
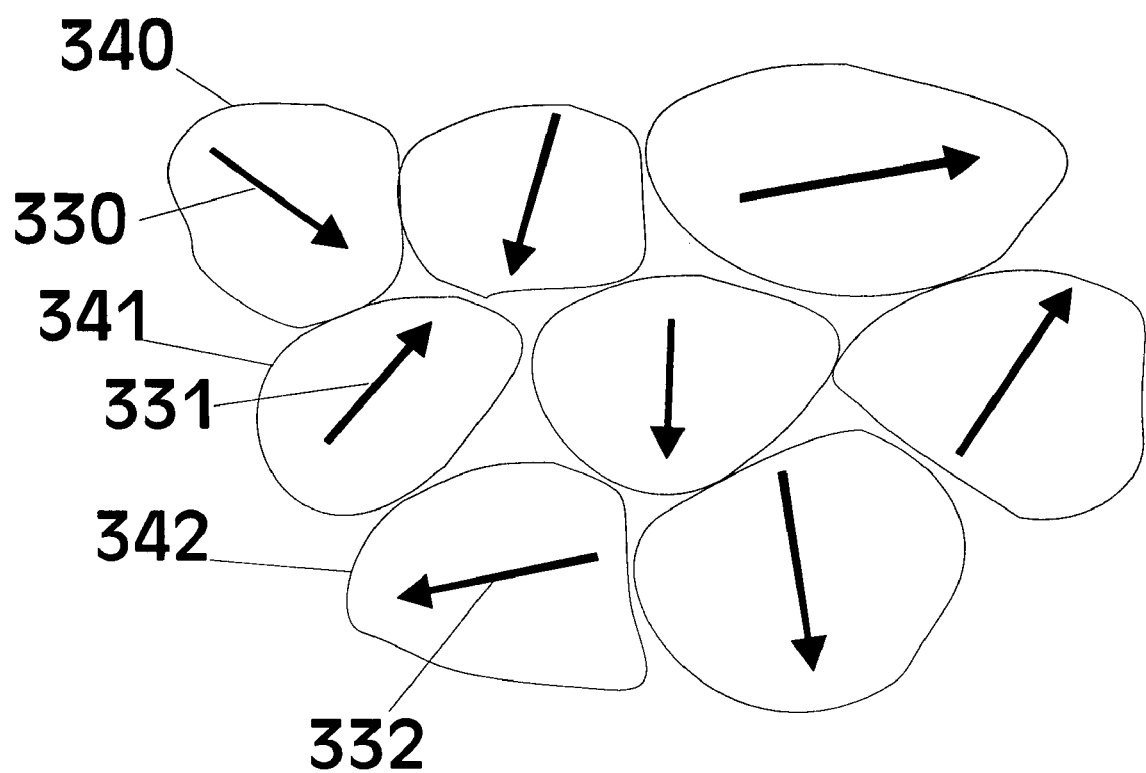
FIG. 2D is a schematic planar view of the magnetic tunnel junction formed according to the methodology of FIG. 2A showing the crystallographic orientation of crystalline grains within the polycrystalline structure.

The preferred embodiments and implementations of the invention are directed to magnetic layers and MgO or Mg—ZnO tunnel barrier layers which are substantially (100) oriented or textured. This is shown schematically in FIG. 2(c), which shows the arrangement of atoms in a bcc structure oriented in the (100) direction with respect to the direction of tunneling of electrons. Layers 320, 321, 322 of atoms within an individual grain are shown for rows of atoms oriented along the [010] direction in-plane (indicated by the arrow 315) and [100] direction perpendicular to the plane (indicated by the arrow 310).

The magnetic and tunnel barrier layers are polycrystalline and are comprised of grains or crystallites which range in lateral extent from approximately one hundred to several hundred angstroms. Thus, these layers and the overall film structure are what is commonly referred to as textured. Texturing implies that there is a predominant crystallographic orientation of individual layers and/or the overall film structure, but that the grains are not perfectly aligned along one particular direction. Individual grains may not be precisely oriented with their (100) direction along the normal to the film layer. The (100) direction within individual grains (shown by the arrow 310 in FIGS. 2(b) and 2(c)) may be oriented away from the normal to the plane of the film by an angle that can vary from a small fraction of one degree to several degrees or even tens of degrees for poorly textured films. The angular range of these (100) directions can be used to quantify the degree of (100) crystalline texture of the film structure and can be measured using various structural characterization techniques, including cross-section transmission electron microscopy and various x-ray diffraction techniques. There may also be present grains which are oriented in a completely different direction, but the proportion of these grains is small for the method of formation of the magnetic tunnel junction structures described herein.

The crystalline grains may be randomly oriented with respect to a direction within the plane of the substrate on which the film structures are grown, as shown in the schematic illustration in FIG. 2(*d*). Various individual grains 340, 341 and 342 are shown within the plane of the film (looking down along the normal to the plane) of various shapes and sizes. The (010) direction (illustrated by the arrow 315 in FIG. 2(*c*)) within the grains 340, 341, 342 are indicated by the arrows 330, 331 and 332, respectively. The (010) direction may not lie exactly in the plane of the film but may be at an angle to this plane. It is the orientation or texturing of the film which is important with regard to the preferred embodiments herein. Whereas the maximum TMR is obtained for film structures which are highly textured, the TMR will be increased to the extent that the film structure is textured. It is preferred that the angular range of a (100) direction within the grains be within + or −20 degrees of the film normal, or more preferably within + or −10 degrees, and even more preferably within + or −5 degrees. As used herein, the term "(100) oriented" should be understood to include the aforementioned deviations from the ideal case, in which all the grains are precisely oriented with their (100) direction along the normal to the film layer.

Theoretical predictions of high TMR in MTJs formed from Fe/MgO/Fe were based on perfectly atomically ordered structures in which there was no disorder within the Fe and MgO layers and no disorder at the Fe/MgO interface. Even small amounts of disorder should, in principle, invalidate the conclusions of these simple-minded theoretical predictions, since the high TMR values are related to the spin-dependent tunneling of wave-functions of a particular symmetry from the Fe layer through the MgO tunnel barrier. Exotic techniques, such as molecular beam epitaxy and deposition at elevated temperatures on single crystalline substrates, are not useful for the mass-manufacturing of cheap devices for MRAM and other applications, particularly since manufactured devices are typically grown on template layers which are either amorphous or polycrystalline.

The structures and the associated methods of preparing them described herein are entirely compatible with mass manufacturing of these devices on a wide variety of templates which are not required to have any particular crystal structure or orientation. As illustrated in FIGS. 2(*b*) and (*c*), the structures produced using the methods described herein are not expected to be single crystalline but rather highly textured polycrystalline films. Moreover, these films, since they are prepared at nominally room temperature (although these structures could be deposited at elevated temperatures, providing these temperatures do not result in significant interdiffusion of the layers or significantly increased roughness or other changes in the polycrystalline structure or morphology not consistent with the required structural elements for high TMR or spin polarization), are likely to contain significant atomic disorder. Even small amounts of disorder are likely to significantly reduce the TMR values predicted by theory, so it is very surprising that high TMR is observed in the devices and structures prepared using the methods described in the current invention.

The TMR of MTJs using conventional amorphous alumina tunnel barriers is not very sensitive to the crystallographic orientation of the ferromagnetic electrodes 18 and 34 (see FIG. 1B). Thus Ruthenium (Ru) antiferromagnetic coupling layers 17, which take up the hcp (hexagonal close packed) crystal structure, can be used irrespective of whether the ferromagnetic layers 18 and 19 are formed from fcc or bcc alloys. However, the insertion of a Ru layer within the lower ferromagnetic electrode of the MTJ 200 results in a deleterious effect on the TMR exhibited by the MTJ 200. This can be reasonably attributed to the unfavorable crystallographic texture of CoFe layers grown on top of the Ru layer. Thus, it is preferable to form synthetic antiferromagnetic reference electrodes which maintain a (100) oriented bcc ferromagnetic layer on which the MgO barrier can be formed. One such preferred structure is now described with reference to FIG. 3.

Figure 3:
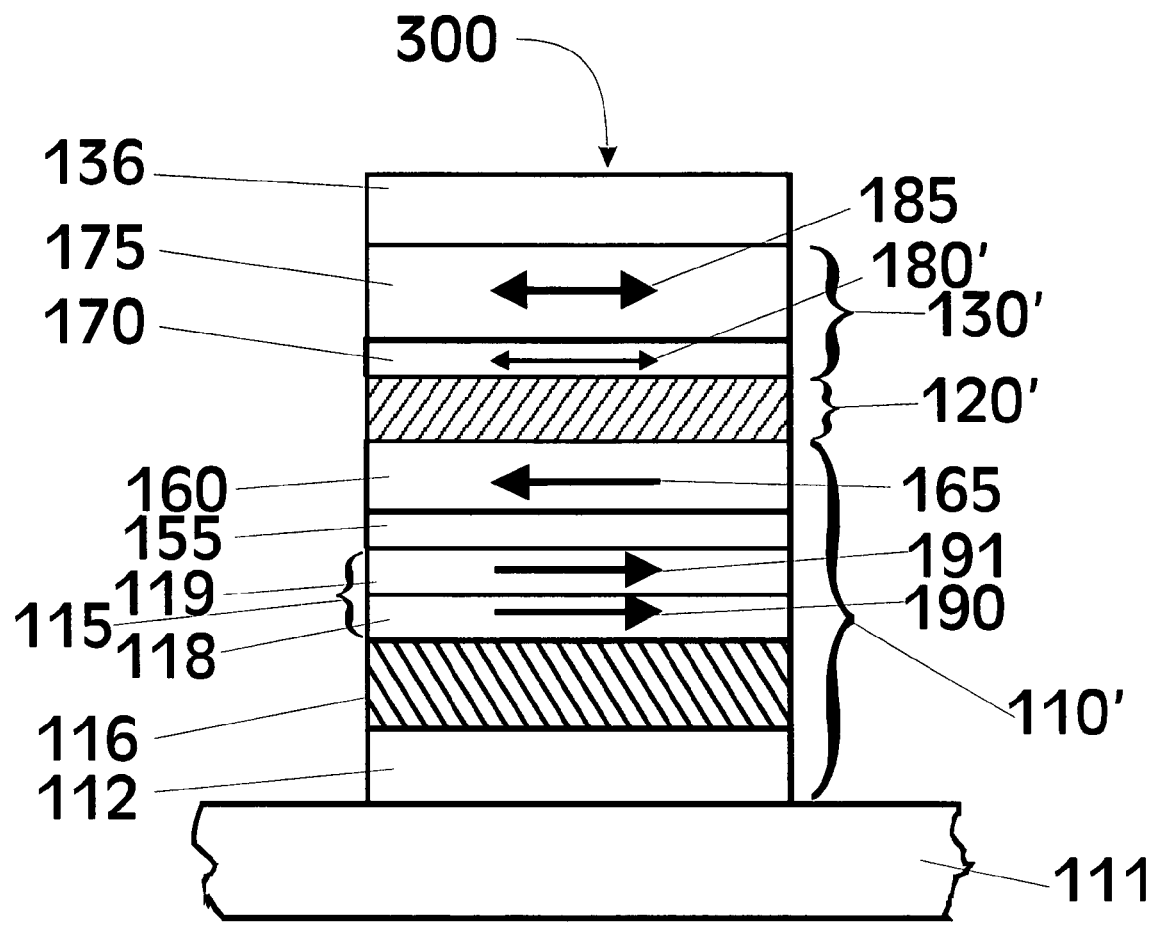
FIG. 3 is a cross-sectional view of a magnetic tunnel junction of the present invention.

In FIG. 3, the substrate 111 is formed from an amorphous layer of $SiO_2$ formed on a silicon substrate. The underlayer or bottom electrical lead 112 is comprised of a 200 Å bilayer of TaN and Ta. TaN is formed by reactive magnetron sputtering from a Ta target in an Ar—$N_2$ gas mixture where the mixture contains ~6% nitrogen. The nitrogen content in the gas mixture is chosen to give a slightly nitrogen deficient TaN layer which gives rise to an improved texturing of the overlying Ta layer and IrMn layer 116. The Ta layer of the underlayer 112 may be 75 Å Ta sputter deposited using the same Ta target but using pure argon sputtering gas. An antiferromagnetic layer 116 of IrMn 250 Å thick is deposited on the Ta layer by ion beam sputter deposition using a beam of energetic krypton ions from an rf plasma ion source. Next a ferromagnetic layer 115 of 25 Å $Co_{70}Fe_{30}$ is deposited. The layer 115 may be formed from one or more ferromagnetic layers 118 and 119. An antiferromagnetic coupling layer 155 formed from 17.5 Å $Cr_{80}Mo_{20}$ is deposited on top of layer 115. The lower ferromagnetic electrode 110' is completed with the layer 160 (whose magnetic orientation is given by the arrow 165), which is formed from 25 Å $Co_{70}Fe_{30}$. The layers 160 and 115 are antiferromagnetically coupled by indirect exchange coupling through the metallic CrMo layer 155.

An MgO tunnel barrier is then formed on top of the lower ferromagnetic electrode 110' using the method described in U.S. patent application Ser. No. 10/824,835 to Parkin titled "MgO tunnel barriers and method of formation" (filed Apr. 14, 2004), supra, by first depositing a thin layer of Mg having a thickness in the range of 3 to 20 Å followed in a second step by the deposition of a layer of Mg in the presence of reactive oxygen. The thickness of the second layer, which is comprised of MgO, is typically in the range from 2 to 30 Å depending on the desired resistance-area product, which can range up to more than $10^9 \Omega(\mu M)^2$.

Finally the MTJ device shown in FIG. 3 is completed by forming the top ferromagnetic electrode 130' which is the storage layer. The storage layer may be formed from a bilayer of two ferromagnetic layers. First a crystalline layer 170 comprised of 20 Å $Co_{70}Fe_{30}$ is deposited by magnetron sputter deposition followed by a layer 175 which is comprised of a Co—Fe—B alloy, specifically, $(Co_{70}Fe_{30})_{80}B_{20}$ which is 120 Å thick. The layer 175 is also deposited by magnetron sputter deposition from a single sputter target. Layer 175 is nominally amorphous in nature. The addition of a sufficient quantity of B to CoFe causes the alloy to become amorphous. The use of a bilayer storage layer 130' or a storage layer comprised solely of a nominally amorphous ferromagnetic layer 175 surprisingly gives rise to MTJs with improved magnetoresistance and magnetic properties when used with crystalline MgO tunnel barriers as compared to storage layers comprised solely of a crystalline CoFe alloy. The two ferromagnetic layers 170 and 175 are strongly exchange coupled one to the other and so behave as a single magnetic moment. The orientation of the magnetic moment of the layer 170 is indicated by the double headed arrow 180' and that of the layer 175 by the arrow 185, but the moments of the two layers are always parallel to one another for sufficiently thin ferromagnetic layers.

The storage layer 130' is capped with a layer 136 which is here comprised of 100 Å TaN|followed by 75 Å Ru. The TaN is formed by reactive sputtering of Ta in an Ar—$N_2$ gas mixture where the $N_2$ composition is chosen so that the TaN is fully nitrided. A gas mixture with 10% $N_2$ was used here.

Figure 4:
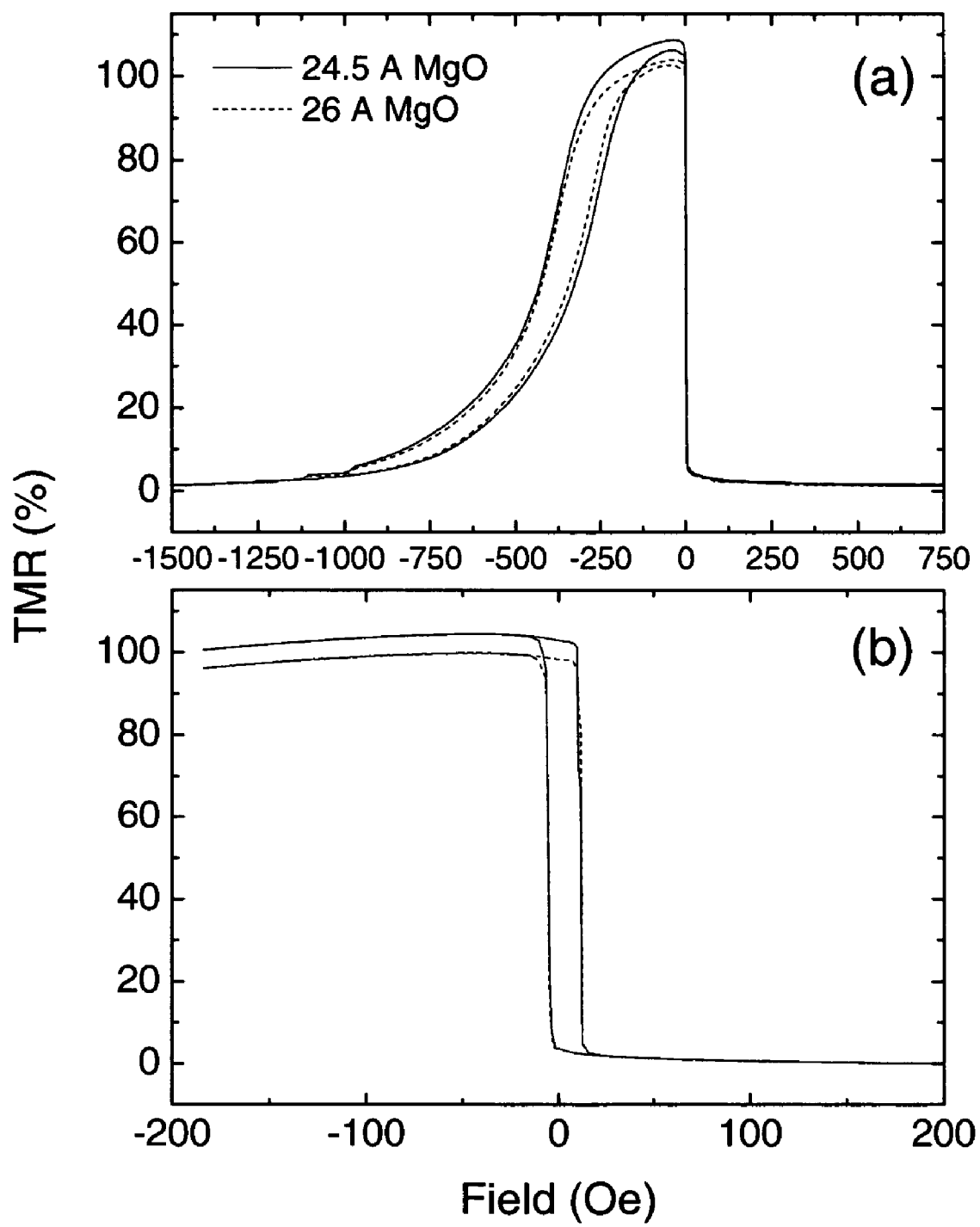
FIG. 4, which includes

Typical resistance-versus-field curves for the structure shown in FIG. 3 are presented in FIG. 4. The data in FIG. 4A show a TMR exceeding 100% which is far higher than has previously been observed for MgO-based MTJs with a synthetic antiferromagnet reference layer. The exchange bias of the IrMn antiferromagnetic exchange bias layer was set by annealing the samples at 260° C. for 90 minutes in a high vacuum anneal furnace in the presence of a magnetic field of 1 Tesla. The MgO tunnel barrier corresponding to the data in FIG. 4 was formed by first depositing a Mg layer 6 Å thick followed by the reactive magnetron sputter deposition of an MgO layer 24.5 and 26 Å thick, respectively for the two sets of data.

Figure 5:
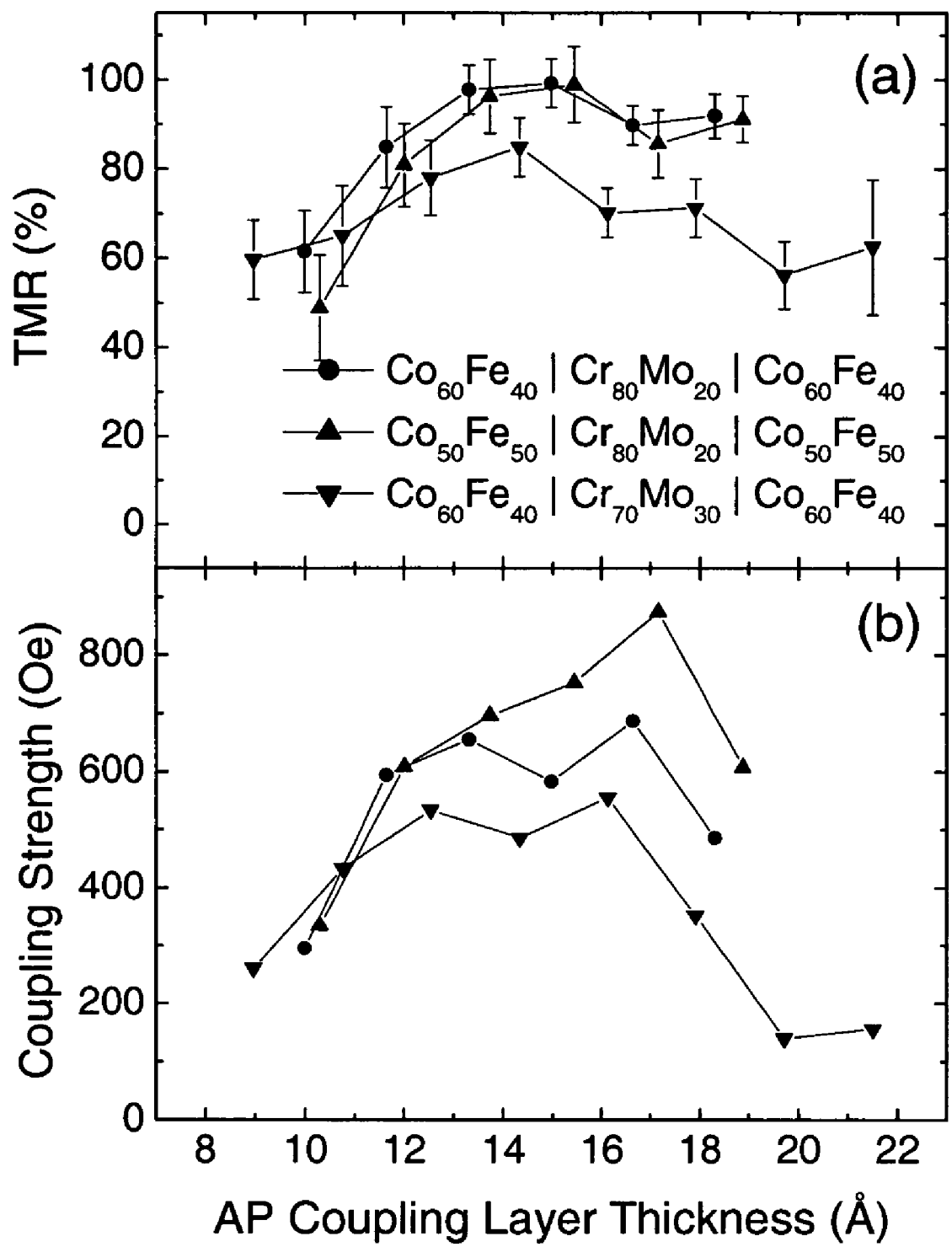
FIG. 5, which includes

FIG. 5 shows the dependence of (a) the tunneling magnetoresistance and (b) the antiferromagnetic coupling field for various MTJs of the present invention with two different Co—Fe alloy reference layer compositions as a function of thickness of the Cr—Mo antiferromagnetic coupling layer for two different Cr—Mo compositions. The detailed structure of the MTJs was 200 Å TaN|75 Å Ta|250 Å IrMn|25 Å $Co_{60}Fe_{40}$ or $Co_{50}Fe_{50}$ |xÅ CrMo|25 Å $Co_{60}Fe_{40}$ or $Co_{50}Fe_{50}$|MgO|20 Å $Co_{60}Fe_{40}$ or $Co_{50}Fe_{50}$|120 Å $(Co_{70}Fe_{30})_{80}B_{20}$|100 ÅTaN|75 Å Ru|. The MgO was formed using the two step process described earlier. The samples were annealed at 260° C. for 90 minutes in high vacuum and in a field of 1 Tesla to set the IrMn exchange bias. Anneal times can be varied from a few minutes to a few hours depending on the temperature. The higher the temperature, the shorter the anneal required. Rapid thermal annealing is also possible which involves heating the device for the shortest possible time but at higher temperatures.

The TMR was found to depend strongly on the composition of the Co—Fe reference ferromagnetic layers 115 and 160 with higher Fe content yielding higher TMR. The highest TMR values were found for $Co_{100-x}Fe_x$ layers with x~50-60 (i.e., 50-60 atomic %). Similar results were found for $Co_{60}Fe_{40}$ and $Co_{50}Fe_{50}$. The data shown in FIG. 5A are averaged over 10 junctions formed on one wafer where the junctions have areas of ~100×100 $(\mu m)^2$ and are formed by a series of shadow masks placed successively on the silicon substrate without breaking vacuum under computer control.

Antiferromagnetic coupling layers formed from Cr—Mo alloys gave improved TMR compared to layers formed from pure Cr. The likely explanation is that the polycrystalline (100) texture is greater or is improved for Cr—Mo spacer layers compared to pure Cr. On the other hand if too much Mo is added to the alloy the strength of the antiferromagnetic coupling will be greatly diminished. As originally discovered by Parkin (see Phys. Rev. Lett. 67, 3598 (1991) and 64, 2304 (1990)), there is a systematic variation of the overall strength of the oscillatory interlayer exchange coupling in both Cr and Ru spacer layers, such that the coupling strength increases along the 3d, 4d and 5d transition metal periods and is systematically greater for 3d compared to 4d compared to 5d elements from the same column in the Periodic Table. Thus the coupling strength through Mo is much weaker than through Cr. The preferred range of composition of Mo in Cr—Mo alloys is ~10 to 50 atomic % Mo. Moreover, as more Mo is added the oscillation period is decreased making the strength of the antiferromagnetic coupling more sensitive to the thickness of the spacer layer. It is preferred to use an alloy composition with the largest possible period of oscillation of the oscillatory interlayer coupling so that the strength of the antiferromagnetic coupling is not strongly dependent on the spacer layer thickness. This provides a greater window of manufacturability.

The data shown in FIG. 5 are given for CrMo thicknesses of the CrMo layer 155 for which the layers 115 and 160 are antiferromagnetically coupled. The indirect magnetic exchange coupling between two ferromagnetic layers mediated by Cr oscillates between ferromagnetic and antiferromagnetic coupling as the thickness of the Cr spacer layer is increased (see "Oscillations in Exchange Coupling and Magnetoresistance in Metallic Superlattice Structures: Co/Ru, Co/Cr and Fe/Cr", Phys. Rev. Lett. 64, 2304 (1990)). Similarly, for Cr—Mo alloys the coupling also oscillates between ferromagnetic coupling and antiferromagnetic coupling. For the range of CrMo thickness shown in FIG. 5, the coupling is antiferromagnetic but the strength of the coupling varies with the thickness of the CrMo layer and is largest for CrMo thicknesses in the range of 14-16 Å. However, there is a broad range of CrMo thickness for which the coupling is antiferromagnetic which makes the use of CrMo attractive. For example, for an antiferromagnetic coupling layer formed from $Cr_{70}Mo_{30}$, antiferromagnetic coupling is found for thicknesses ranging from ~10 to 20 Å, although the largest magnitude of the coupling is found for thicknesses in the middle of this range. The exact range of thicknesses varies with the Cr—Mo alloy composition but is readily determined by forming a series of MTJ structures in which the thickness of this spacer layer is varied and the magnitude of the coupling strength determined by measuring the field required to bring the moments of the ferromagnetic layers on either side of the spacer layer parallel to one another.

Figure 6:
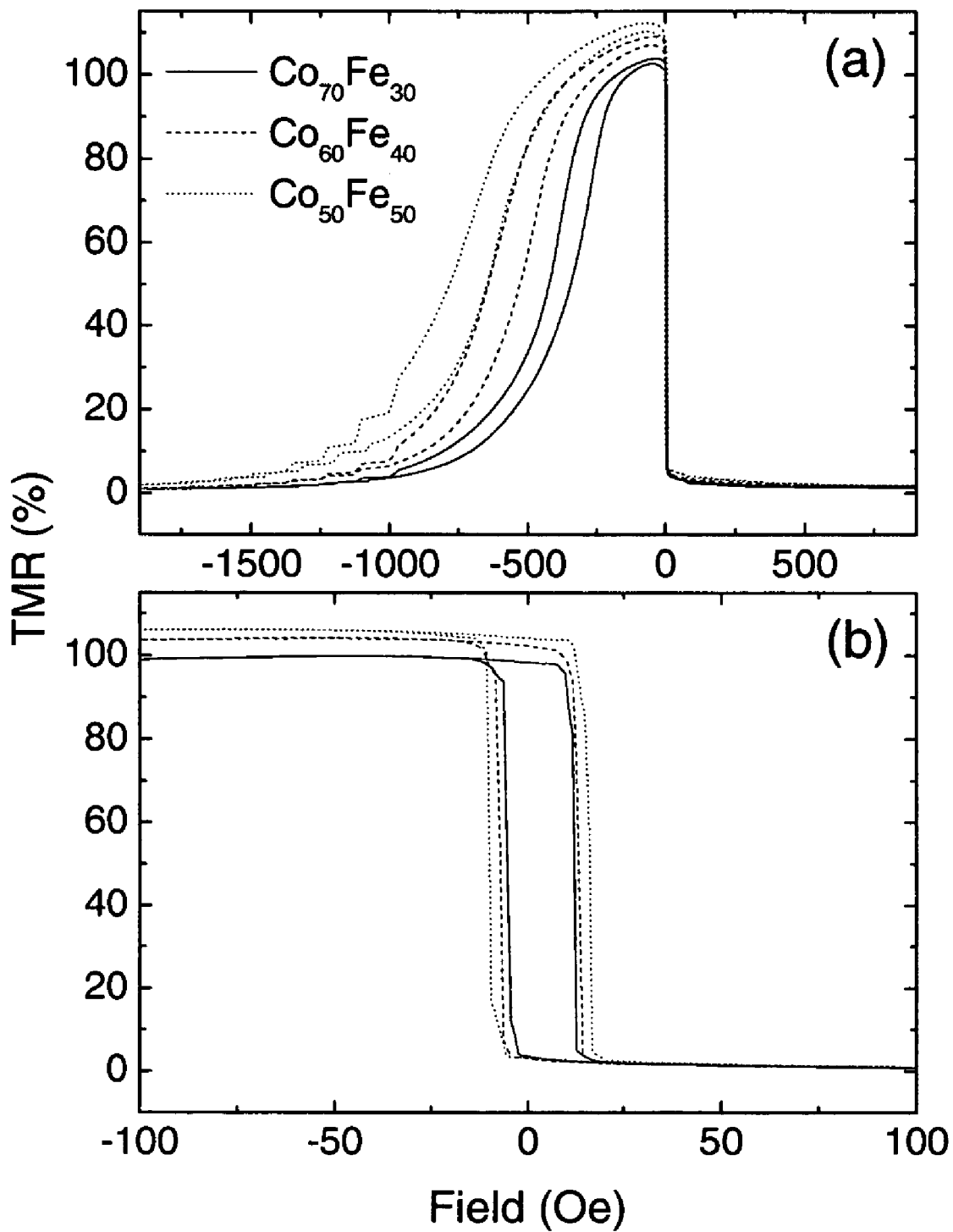
FIG. 6, which includes FIGS. 6A and 6B, compares tunneling magnetoresistance versus field loops for MTJs of the present invention with ferromagnetic layers formed from three different CoFe compositions and antiferromagnetic coupling layers formed from $Cr_{80}Mo_{20}$.

FIG. 6 compares resistance versus field loops for MTJs of (for the same structures used to collect the data in FIG. 5) with ferromagnetic layers formed from three different CoFe compositions (used for layers 115, 160, and 170) and antiferromagnetic coupling layers formed from $Cr_{80}Mo_{20}$. Major and minor loops are shown in FIGS. 6A and 6B, respectively. The layer 175 was formed from $(Co_{70}Fe_{30})_{80}B_{20}$. The TMR is similar for three different CoFe compositions with 30, 40 and 50 atomic % Fe. The coercivity of the storage layer also varies little with CoFe composition for these large area junctions.

Figure 7:
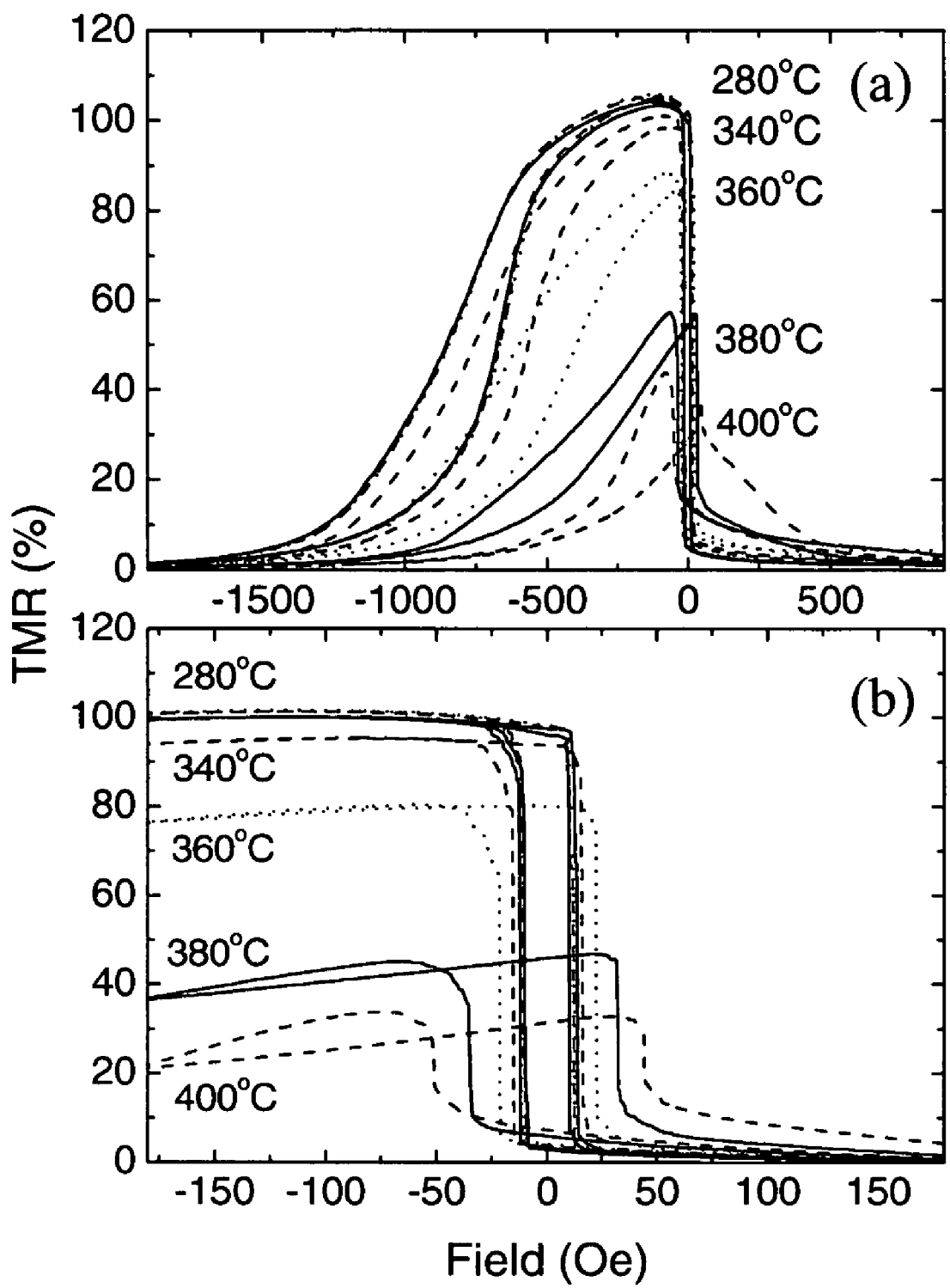
FIG. 7, which includes

The thermal stability of shadow masked MTJs was extensively studied. Results are shown in FIG. 7 for an MTJ of the present invention with a structure of 200 Å TaN 50 Å Ta|250 Å IrMn|25 Å $Co_{60}Fe_{40}$|13.5 Å $Cr_{80}Mo_{20}$|25 Å $Co_{60}Fe_{40}$|MgO|20 Å $Co_{60}Fe_{40}$|120 Å $(Co_{70}Fe_{30})_{80}B_{20}$|100 Å TaN|75 Å Ru|. A sequence of resistance versus field loops are shown, measured at 25° C. for the same sample after the MTJ device was annealed at successively high temperatures shown in the figure. The thermal anneal treatments were carried out in a high vacuum chamber in a fixed 4 kOe field. Each test consisted of a sequence of ramp, soak, and transport measurement steps. The sample was soaked at each anneal temperature for 90 min. After each ramp and soak step the sample was cooled to 25° C. to measure transport properties. The TMR of the MTJ increases slightly with anneal temperature up to 320° C. and then decreases as the sample is further annealed at higher temperatures. Even after the anneal treatment at 340° C. the MTJ device displays a TMR of more than 100%. The antiferromagnetic coupling strength across the CrMo layer is little changed for anneal treatments up to 320° C. but decreases for higher anneal temperatures. After annealing at 400° C., the reference electrode (including layers 118, 119 155, and 160) appears to be no longer AP coupled. The free layer coercivity also increases dramatically at anneal temperatures >340° C. This increased coercivity is likely due to the composition of the interface layer 170 which is formed from the same Co—Fe alloy as the reference ferromagnetic layers 115 and 160. Using an interface layer 170 with lower Fe content results in improved thermal stability.

Figure 8:
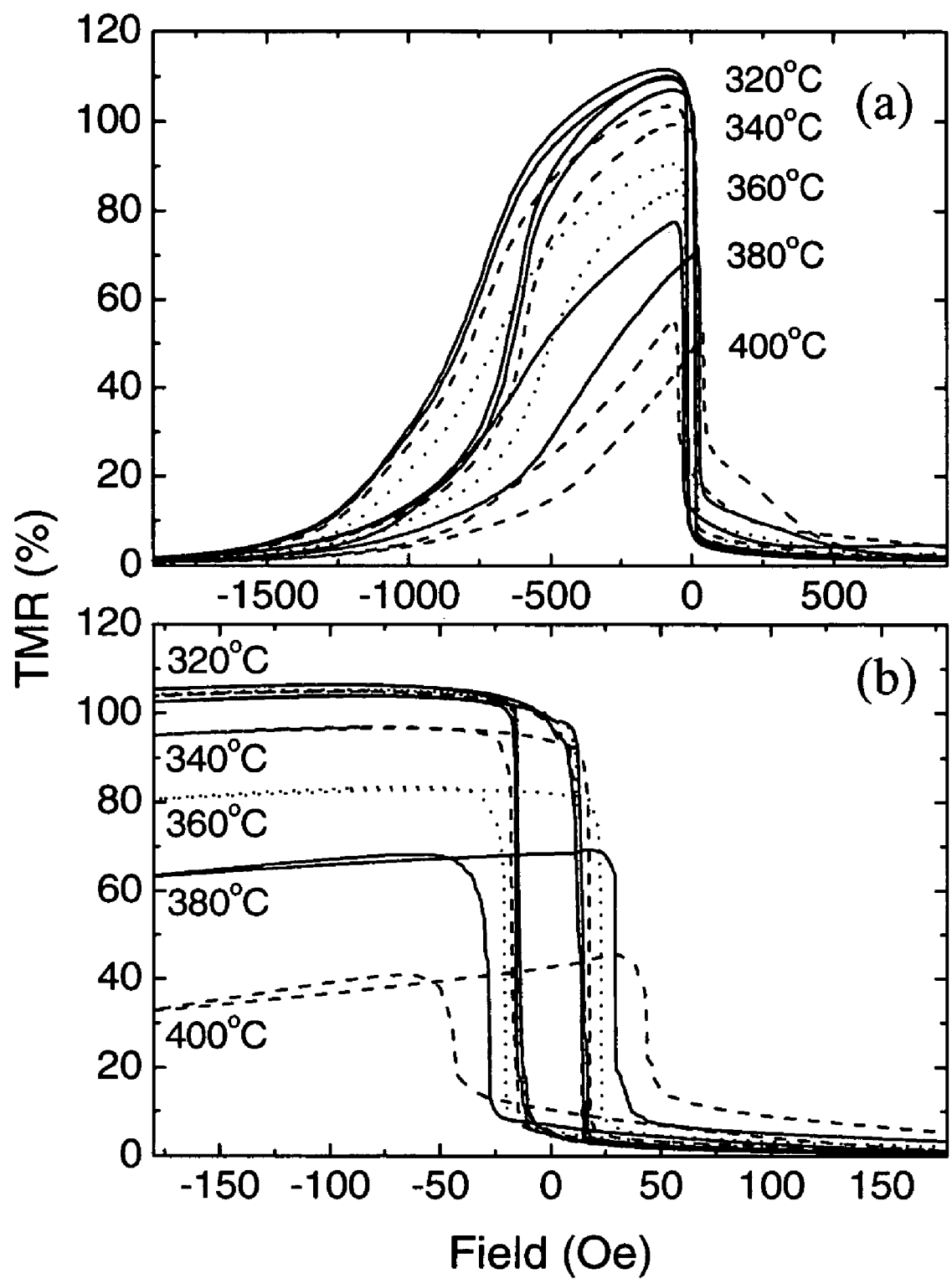
FIG. 8, which includes

FIG. 8 summarizes a series of thermal annealing studies for a sample similar in structure to that shown in FIG. 7 but where a $Co_{50}Fe_{50}$ alloy was used instead of $Co_{60}Fe_{40}$. The TMR reaches a maximum value after an anneal treatment at ~320° C. and drops significantly for anneal temperatures above 360° C. However, even after anneal treatments at 400° C. the reference electrode remains antiferromagnetically coupled. Thus not only is the AP coupling strength with $Co_{50}Fe_{50}$ alloy stronger but the thermal stability is also superior.

Figure 9:
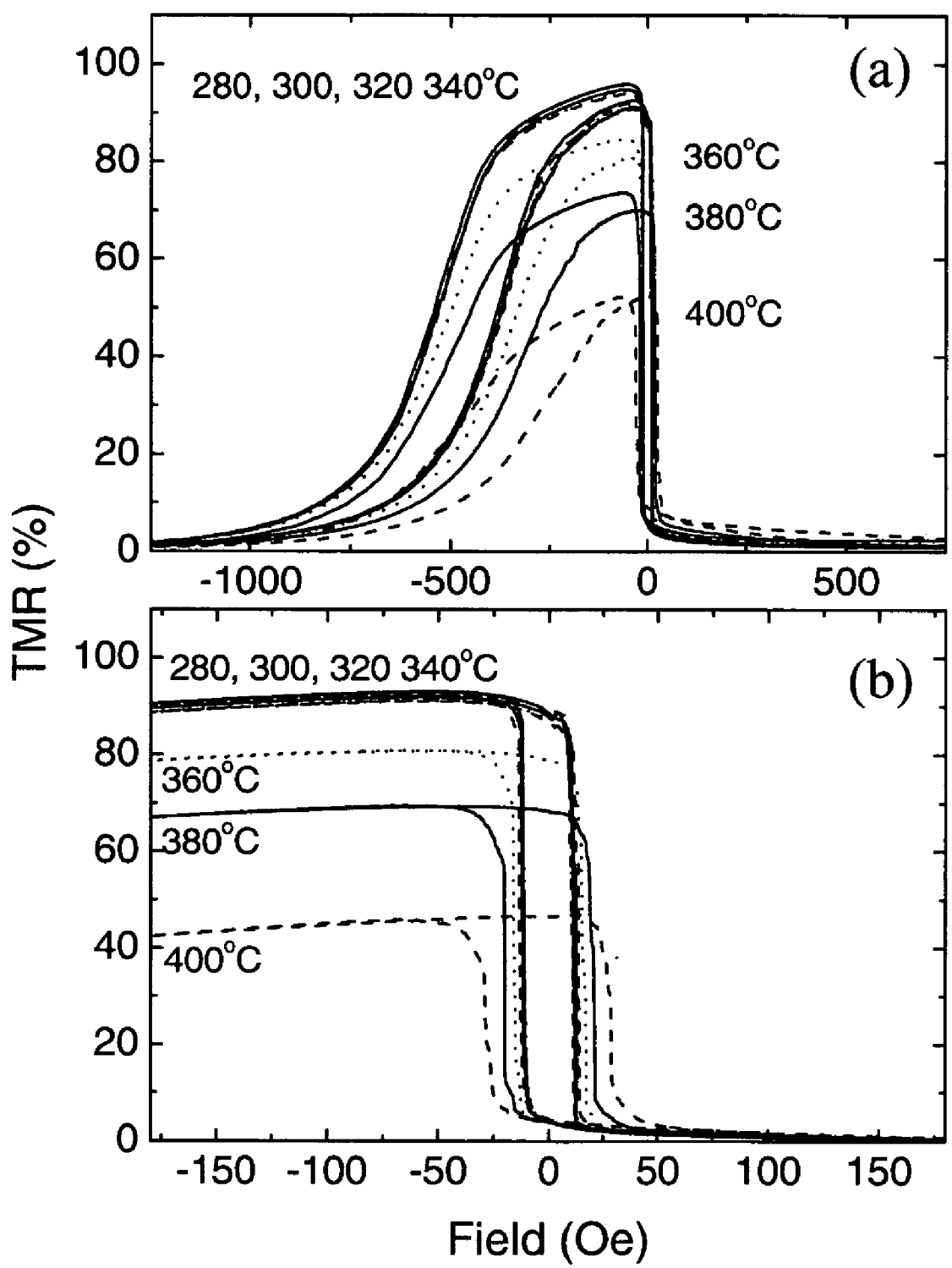
FIG. 9, which includes

FIG. 9 summarizes TMR loops obtained as a function of annealing temperature for an MTJ device with a structure 200 Å TaN|50 Å Ta|250 Å IrMn|25 Å $Co_{60}Fe_{40}$|14.4 Å $Cr_{70}Mo_{30}$|25 Å$Co_{60}Fe_{40}$|MgO|20 Å$Co_{60}Fe_{40}$|120 Å $(Co_{70}Fe_{30})_{80}B_{20}$|100 Å TaN |75 ÅRu|. The structure is similar to that of the MTJ stack used in FIG. 7 but the antiferromagnetic coupling layer is formed from $Cr_{70}Mo_{30}$. The thermal stability is significantly improved using a Cr—Mo alloy with higher Mo content although the TMR is slightly lower. The TMR is essentially unchanged for anneal temperatures up to 340° C. and then decreases gradually for anneals at higher temperatures. Even after an anneal treatment at 400° C. the reference layer remains antiferromagnetically coupled and displays a TMR of ~52%. Furthermore, the free layer coercivity shows only a slight increase for anneal temperatures up to 380° C. Thus thermal stability studies indicate that the thermal stability of MTJs of the present invention improves with increasing Fe content of the CoFe alloy to $Co_{50}Fe_{50}$ and with increasing Mo content of CrMo alloy to $Cr_{70}Mo_{30}$.

The use of Cr—Mo alloys gives rise to improved TMR compared to the use of pure Cr antiferromagnetic coupling layers. One possible explanation is that Cr—Mo is better lattice matched to CrFe than is Cr. The lattice parameter of bulk Cr which is bcc is 2.91 Å, whereas that of MgO which takes up a simple cubic lattice is 4.216 Å. The (100) orientation of MgO lattice matches bcc Fe or CoFe reasonably well when the respective lattices are rotated by 45 degree with respect to one another. The MgO lattice rotated by 45 degrees and divided by $\sqrt{2}$ has a length of 2.982 Å. Adding Mo to Cr increases the lattice parameter significantly to better lattice match that of the rotated MgO lattice. For example bcc $Cr_{70}Mo_{30}$ has a lattice parameter of ~2.981 Å (by assuming that the lattice parameter increases linearly when Mo is added to Cr and by interpolating between the Cr and Mo bulk lattice parameters).

Figure 10:
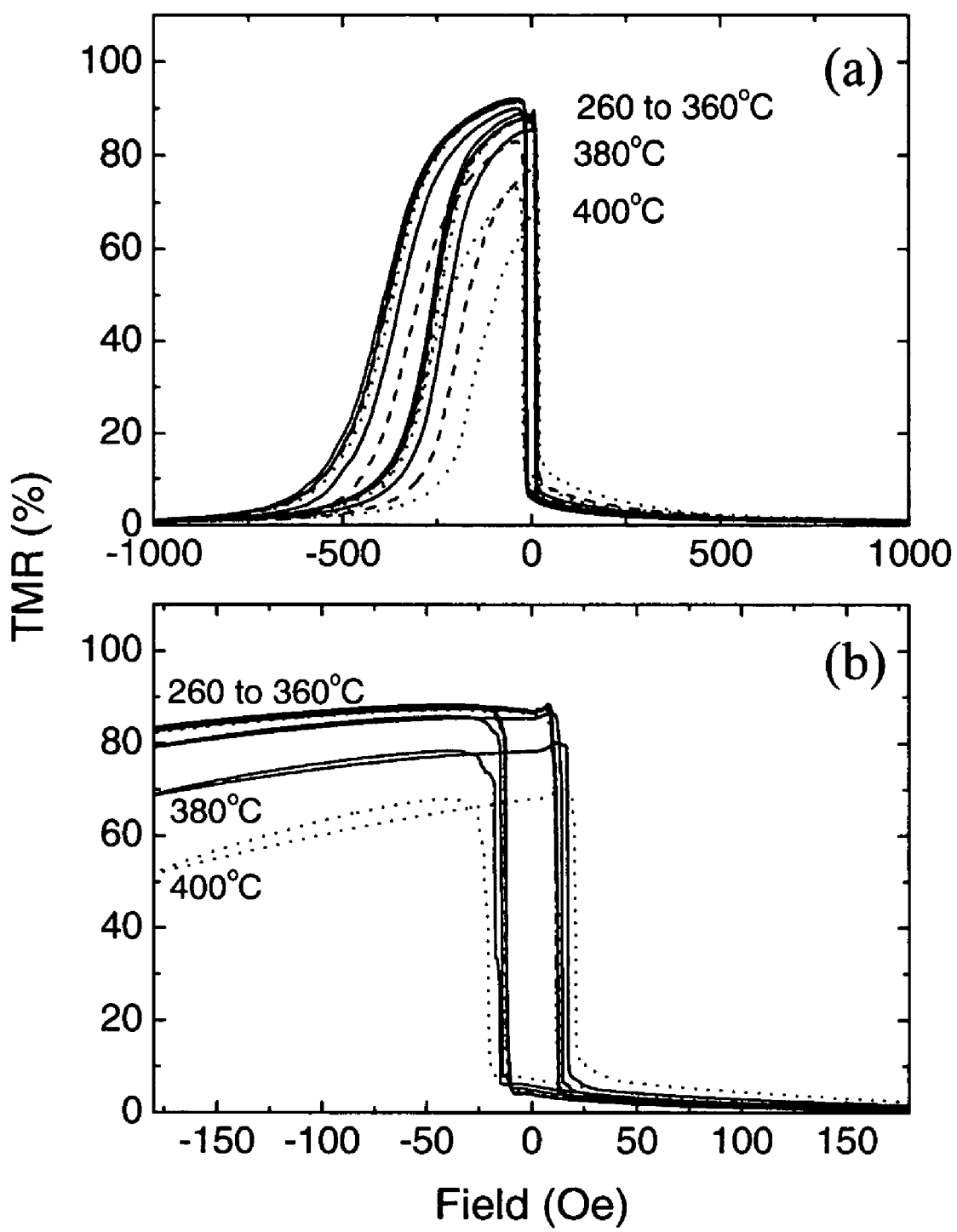
FIG. 10, which includes

Cr may be diluted with other diluents while maintaining its bcc structure. These include V, Nb W, and Fe. Alloys of Cr with V, Nb, W, and Fe may be used as the antiferromagnetic coupling layer 155. One example is shown in FIG. 10 where the layer 155 is formed from a Cr—Nb alloy with composition $Cr_{80}Nb_{20}$. The layer 155 preferably has a thickness of between 3 and 30 angstroms; it may advantageously comprise at least 50 atomic % Cr, or at least 70 atomic % Cr. If Mo is used as a diluent, the Mo content of the Cr—Mo alloy may advantageously be between 10 and 40 atomic %. Likewise, if Nb is used as a diluent, the Nb content of the Cr—Nb alloy may advantageously be between 10 and 40 atomic %. If Fe is alloyed with Cr, the Fe content of the alloy may advantageously be between 15 and 60 atomic % provided that the alloy is non-ferromagnetic and non-ferrimagnetic. For each of these alloys of a given composition, a thickness of the antiferromagnetic coupling layer 155 is preferably chosen so that the magnetic moments of the ferromagnetic layers on each side of this layer are antiferromagnetically coupled. It may also prove advantageous under some circumstances that the thickness and composition of the layer 155 are chosen so that the magnetic moments of the surrounding ferromagnetic layers are coupled ferromagnetically to one another or are only very weakly magnetically coupled. For example, Parkin and Thomas in the U.S. Pat. No. 6,166,948 titled "Magnetic memory array with magnetic tunnel junction memory cells having flux-closed free layers" describe magnetic tunnel junction memory cells with ferromagnetic storage layers formed from magnetic layers whose magnetic moments are aligned antiparallel to one another because of magnetostatic dipolar coupling fields arising from poles at the edges of the device. The magnetic layers are separated by a spacer layer which does not need to provide any antiferromagnetic coupling. In another example, it may be advantageous to form the reference layer from a multiplicity of ferromagnetic layers separated by a multiplicity of spacer layers of the current invention which provide antiferromagnetic, ferromagnetic or very weak magnetic coupling. The thermal stability of the MTJ device may be improved, for example, by inserting one or more thin non-ferromagnetic, non-ferrimagnetic spacer layers of the current invention within the ferromagnetic layers 115 and 160 which provide ferromagnetic coupling.

FIG. 10 summarizes resistance versus field loops obtained as a function of annealing temperature for a MTJ stack with a structure 200 Å TaN|75 Å Ta|250 Å IrMn|25 Å $Co_{60}Fe_{40}$|18.8 Å $Cr_{80}Nb_{20}$|25 Å $Co_{60}Fe_{40}$|MgO|20 Å $Co_{60}Fe_{40}$|120 Å $(Co_{70}Fe_{30})_{80}B_{20}$|100 Å TaN|75 Å Ru|. The antiferromagnetic coupling strength provided by $Cr_{80}Nb_{20}$ alloys is only slightly lower than that obtained with $Cr_{80}Mo_{20}$ alloys. Although the TMR obtained with CrNb coupling layer is slightly lower than that obtained with CrMo coupling layers the MTJ stack is more thermally stable. Even after a final anneal treatment at 400° C. for 90 min a tunneling magnetoresistance of more than ~72% was found. The preferred range of composition of Nb in Cr—Nb alloys is ~10 to 50 atomic % Nb. Adding increasing amounts of Nb decreases the strength of the oscillatory interlayer coupling and also decreases the oscillation period, similar to the behavior observed in Cr—Mo alloys.

FIG. 3 shows an MTJ device in which the electrode formed beneath the MgO tunnel barrier is the reference ferromagnetic electrode. The magnetic state of the reference electrode remains unchanged during the operation of the device. An antiferromagnetic layer 116 is used to set the direction of the moment of the ferromagnetic layer 115 by exchange bias. The direction of the exchange bias field is set either during the fabrication of the MTJ device or by heating the device above the blocking temperature of the antiferromagnetic layer and cooling the device in the presence of a magnetic field, sufficiently large to align the moment of the layer 115 along a given direction. The antiferromagnetic layer is preferred but the device may be built without the layer 116. The direction of the reference electrode, especially that of the ferromagnetic layer 160 closest to the MgO tunnel barrier, is then maintained during the operation of the device by providing a uniaxial anisotropy field. This may be provided by the intrinsic magneto-crystalline anisotropy of one or both of the layers 115 and 160 or may be provided by the shape anisotropy of the reference electrode or by other means.

In FIG. 3 the electrode 130' above the tunnel barrier 120' is the storage layer whereby during the operation of the MTJ device the direction of the magnetization of this layer is either parallel or antiparallel to that of the layer 160 on the other side of the tunnel barrier. The MTJ device of FIG. 3 may also be inverted such that the reference ferromagnetic electrode is formed above the tunnel barrier and the storage layer is formed beneath the tunnel barrier.

Figure 11:
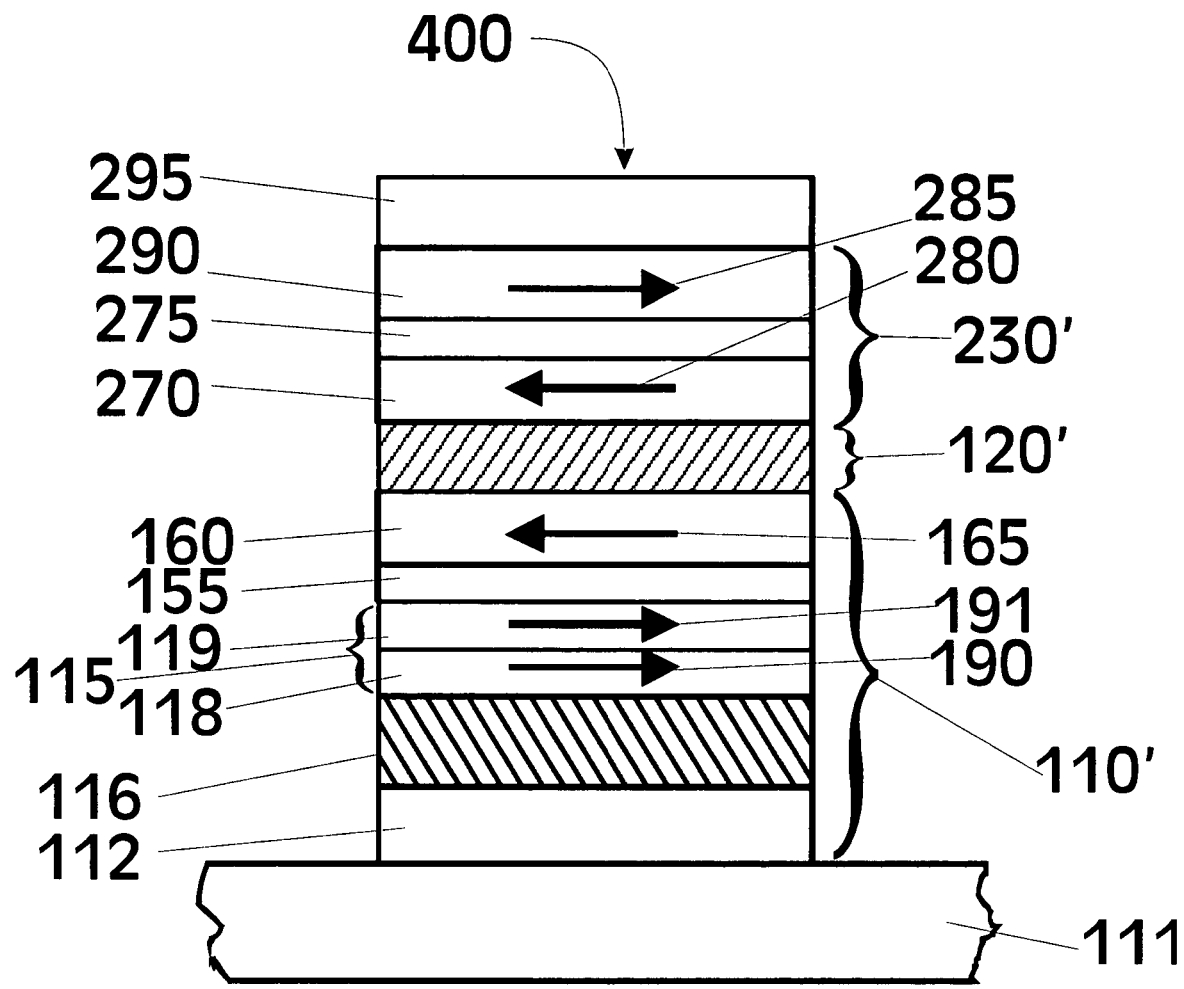
FIG. 11 is a cross-sectional view of another magnetic tunnel junction of the present invention, in which the storage layer is formed from an antiferromagnetically coupled sandwich similar to that of the reference layer.

In another embodiment the storage layer may also be formed from an antiferromagnetically coupled sandwich similar to that of the reference layer. This embodiment is illustrated by the MTJ 400 of FIG. 11. As shown in FIG. 11 a ferromagnetic layer 270 is deposited on top of the tunnel barrier 120' followed by an antiferromagnetic coupling layer 275 and finally a second ferromagnetic layer 290. The ferromagnetic layers 270 and 290 may be comprised of one or more layers formed from various bcc Co—Fe alloys. In a preferred embodiment, the thicknesses and compositions of these layers are chosen so that the magnetic moments of layers 270 and 290 are approximately equal. The thickness of the antiferromagnetically coupling layer 275 is chosen so that the magnetic moments of 270 and 290 are oriented anti-parallel to one another; the directions of these moments are indicated by the arrows 280 and 285, respectively. The layer 275 is formed from a bcc non-ferromagnetic, non-ferrimagnetic metal such as an alloy of Cr with other bcc metals including V, Mo, Nb, W, and Fe. In order to obtain high TMR from the device 400, the layer 270 should be bcc and preferably textured in the (100) orientation. Since the layer 270 is preferably thin, the bcc structure of the layer 270 may be stabilized and improved by forming the antiferromagnetic coupling layer 275 and the ferromagnetic layer 290 from bcc metals. However, this is not necessarily required. Thus the layer could be formed from a non-bcc antiferromagnetic coupling layer such as Ru, and the layer 290 could be formed from a non-bcc ferromagnetic metal such permalloy ($Ni_{81}Fe_{19}$). The storage layer 230' is capped with a layer 295 which may be comprised of a conducting material. The ferromagnetic layer 270, the anti-ferromagnetic coupling layer 275, and the ferromagnetic layer 290 together constitute the top ferromagnetic electrode 230'.

Although examples of the various embodiments of the current invention have been described with regard to the use of MgO tunnel barriers, the MgO tunnel barrier may be replaced by a barrier formed from $Mg_{1-x}Zn_xO$ or from a barrier comprised of multiple layers of $Mg_{1-x}Zn_xO$, where x is varied from layer to layer or may be formed from one or more layers of MgO and $Mg_{1-x}Zn_xO$. (See U.S. application Ser. No. 10/734,425 to Parkin titled "Mg—Zn oxide tunnel barriers and method of formation" filed Dec. 12, 2003.)

Similarly, the MgO tunnel barrier could be replaced by one of the family of simple cubic or zinc blende tunnel barriers including ZnS, ZnSe and ZnTe, CdS, CdSe and CdTe, and AlAs and related materials including insulating $Al_{1-x}Ga_xAs$. These materials will grow in a highly textured crystallographic orientation on bcc ferromagnetic metals.

While the preferred embodiments of the current invention apply to structures with (100) texturing for the highest possible TMR or spin polarization values, the structures and devices described herein may be prepared in other crystallographic orientations, and so be advantageous in other regards.

While the present invention has been particularly shown and described with reference to the preferred embodiments, it will be understood by those skilled in the art that various changes in form and detail may be made without departing from the spirit and scope of the invention. Accordingly, the disclosed invention is to be considered merely as illustrative and limited in scope only as specified in the appended claims.

What is claimed is:

1. A magnetic tunneling device, comprising:
a first body centered cubic (bcc) magnetic layer and a second bcc magnetic layer, wherein the first and second bcc magnetic layers include material selected from the group consisting of ferromagnetic materials and ferrimagnetic materials;
at least one spacer layer of bcc material between the bcc magnetic layers, wherein the spacer layer exchange couples the first and second bcc magnetic layers;
a tunnel barrier in proximity with the second bcc magnetic layer to permit spin-polarized current to pass between the tunnel barrier and the second bcc magnetic layer, wherein the tunnel barrier is selected from the group consisting of MgO and Mg—ZnO tunnel barriers; and
a free magnetic layer in proximity with the tunnel barrier, wherein the free magnetic layer includes material selected from the group consisting of ferromagnetic materials and ferrimagnetic materials, the device forming a magnetic tunnel junction having a tunneling magnetoresistance of at least 100% at room temperature.

2. The device of claim 1, wherein each of the first magnetic layer, the spacer layer, the second magnetic layer, and the tunnel barrier is (100) oriented.

3. The device of claim 1, wherein each of the first magnetic layer, the spacer layer, the second magnetic layer, and the tunnel barrier is polycrystalline.

4. The device of claim 3, wherein each of the first magnetic layer, the spacer layer, the second magnetic layer, and the tunnel barrier includes polycrystalline grains whose lateral extent is in the range of 100 to 500 angstroms.

5. The device of claim 3, wherein the tunnel barrier is a MgO tunnel barrier.

6. The device of claim 5, wherein the MgO tunnel barrier has a thickness of between 3 and 20 angstroms.

7. The device of claim 3, wherein the tunnel barrier is a Mg—ZnO tunnel barrier.

8. The device of claim 7, wherein the Mg—ZnO tunnel barrier has a thickness of between 3 and 50 angstroms.

9. The device of claim 3, wherein each of the magnetic layers includes ferromagnetic material.

10. The device of claim 1, wherein the spacer layer includes Cr.

11. The device of claim 10, wherein the spacer layer is at least 50 atomic % Cr.

12. The device of claim 10, wherein the spacer layer is at least 70 atomic % Cr.

13. The device of claim 10, wherein the spacer layer includes a non-ferromagnetic, non-ferrimagnetic alloy of Cr and at least one element selected from the group consisting of V, W, and Fe.

14. The device of claim 10, wherein the spacer layer includes an alloy of Cr and Mo.

15. The device of claim 14, wherein the Mo content of the alloy is between 10 and 50 atomic %.

16. The device of claim 14, wherein the thickness of the spacer layer is between 10 and 20 angstroms.

17. The device of claim 10, wherein the spacer layer includes an alloy of Cr and Nb.

18. The device of claim 17, wherein the Nb content of the alloy is between 10 and 50 atomic %.

19. The device of claim 1, wherein the thickness of the spacer layer is between 10 and 20 angstroms.

20. The device of claim 10, wherein the spacer layer has a thickness of between 3 and 30 angstroms.

21. The device of claim 3, wherein each of the first magnetic layer and the second magnetic layer includes an alloy of Co and Fe.

22. The device of claim 21, wherein the Fe content of the alloy is between 15 and 60 atomic %.

23. The device of claim 1, wherein the tunneling magnetoresistance of the junction is at least 125% at room temperature.

24. The device of claim 1, the free layer comprising:
two additional bcc magnetic layers including material selected from the group consisting of ferromagnetic materials and ferrimagnetic materials; and
at least one additional spacer layer of bcc material between said two additional bcc magnetic layers, wherein the additional spacer layer exchange couples said two additional bcc magnetic layers.

25. The device of claim 1, further comprising an additional layer in proximity with the first bcc magnetic layer that forms an exchange bias with the first bcc magnetic layer, the additional layer including at least one anti-ferromagnetic material.

26. The device of claim 1, wherein the tunnel barrier is annealed at a temperature in the range of 300° C. to 400° C.

27. The device of claim 1, wherein the tunnel barrier is annealed at a temperature of at least 260° C.

28. The device of claim 1, wherein the tunnel barrier is annealed at a temperature greater than 340° C.

29. The device of claim 1, wherein the spacer layer exchange couples the bcc magnetic layers so that their magnetic moments are anti-parallel.

30. The device of claim 1, wherein the spacer layer exchange couples the bcc magnetic layers so that their magnetic moments are parallel.

31. The device of claim 1, wherein the tunnel barrier is in contact with the second magnetic layer.

32. A magnetic tunnel junction device, comprising:
a first (100) oriented, body centered cubic (bcc) magnetic layer and a second (100) oriented, bcc magnetic layer, wherein the first and second bcc magnetic layers include material selected from the group consisting of ferromagnetic materials and ferrimagnetic materials;
at least one spacer layer of (100) oriented bcc material between the bcc magnetic layers, wherein the spacer layer exchange couples the first and second bcc magnetic layers, the spacer layer including Cr;
a (100) oriented tunnel barrier in proximity with the second magnetic layer, wherein the tunnel barrier is selected from the group consisting of MgO and Mg—ZnO tunnel barriers; and
a free magnetic layer in proximity with the tunnel barrier, wherein the free magnetic layer includes magnetic material selected from the group consisting of ferromagnetic magnetic materials and ferrimagnetic materials, wherein the free magnetic layer, the first and second bcc magnetic layers, the spacer layer, and the tunnel barrier form a magnetic tunnel junction that has a tunneling magnetoresistance of at least 100% at room temperature.

33. The device of claim 32, wherein each of the first magnetic layer, the spacer layer, the second magnetic layer, and the tunnel barrier is polycrystalline.

34. The device of claim 33, wherein each of the first magnetic layer, the spacer layer, the second magnetic layer, and the tunnel barrier includes polycrystalline grains whose lateral extent is in the range of 100 to 500 angstroms.

35. The device of claim 32, further comprising an additional layer in proximity with the first magnetic layer that forms an exchange bias with the first magnetic layer, the additional layer including at least one anti-ferromagnetic material.

36. The device of claim 32, wherein the tunnel barrier is a MgO tunnel barrier.

37. The device of claim 36, wherein the MgO tunnel barrier has a thickness of between 3 and 20 angstroms.

38. The device of claim 32, wherein the tunnel barrier is a Mg—ZnO tunnel barrier.

39. The device of claim 38, wherein the Mg—ZnO tunnel barrier has a thickness of between 3 and 50 angstroms.

40. The device of claim 32, wherein each of the magnetic layers includes ferromagnetic material.

41. The device of claim 32, wherein the spacer layer is at least 50 atomic % Cr.

42. The device of claim 32, wherein the spacer layer is at least 70 atomic % Cr.

43. The device of claim 32, wherein the spacer layer includes a non-ferromagnetic, non-ferrimagnetic alloy of Cr and at least one element selected from the group consisting of V, W, and Fe.

44. The device of claim 32, wherein the spacer layer includes an alloy of Cr and Mo.

45. The device of claim 44, wherein the Mo content of the alloy is between 10 and 50 atomic %.

46. The device of claim 32, wherein the spacer layer includes an alloy of Cr and Nb.

47. The device of claim 46, wherein the Nb content of the alloy is between 10 and 50 atomic %.

48. The device of claim 32, wherein the spacer layer has a thickness of between 3 and 30 angstroms.

49. The device of claim 32, wherein each of the first magnetic layer and the second magnetic layer includes an alloy of Co and Fe.

50. The device of claim 49, wherein the Fe content of the alloy is between 15 and 60 atomic %.

51. The device of claim 32, wherein the tunnel barrier is a MgO tunnel barrier, and the tunneling magnetoresistance of the junction is at least 125% at room temperature.

52. The device of claim 32, wherein the tunnel barrier is annealed at a temperature in the range of 300° C. to 400° C.

53. The device of claim 32, wherein the tunnel barrier is annealed at a temperature of at least 260° C.

54. The device of claim 32, wherein the tunnel barrier is annealed at a temperature greater than 340° C.

* * * * *